United States Patent
Jung et al.

(10) Patent No.: US 10,863,634 B2
(45) Date of Patent: *Dec. 8, 2020

(54) COVER WINDOW OF FLEXIBLE DISPLAY DEVICE AND FLEXIBLE DISPLAY DEVICE HAVING THE SAME

(71) Applicant: SAMSUNG DISPLAY CO., LTD., Yongin-si (KR)

(72) Inventors: Jae-Hoon Jung, Yongin-si (KR); Jong-Whan Cho, Yongin-si (KR); Suk-Man Yang, Yongin-si (KR); Young-Sik Yoon, Yongin-si (KR); Jong-In Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/521,660

(22) Filed: Jul. 25, 2019

(65) Prior Publication Data
US 2019/0350092 A1 Nov. 14, 2019

Related U.S. Application Data

(63) Continuation of application No. 15/180,111, filed on Jun. 13, 2016, now Pat. No. 10,375,839.

(30) Foreign Application Priority Data

Aug. 27, 2015 (KR) .................... 10-2015-0120916

(51) Int. Cl.
*H05K 5/00* (2006.01)
*H05K 1/18* (2006.01)
(Continued)

(52) U.S. Cl.
CPC ..... *H05K 5/0017* (2013.01); *G02F 1/133305* (2013.01); *H05K 1/028* (2013.01); (Continued)

(58) Field of Classification Search
CPC ...... H05K 5/0017; H05K 1/028; H05K 1/147; H05K 5/03; H05K 2201/055; (Continued)

(56) References Cited

U.S. PATENT DOCUMENTS

D689,035 S 9/2013 Ryu
D706,300 S 6/2014 Akana et al.
(Continued)

FOREIGN PATENT DOCUMENTS

CN 201409149 2/2010
CN 103034293 4/2013
(Continued)

OTHER PUBLICATIONS

European Search Report dated Nov. 21, 2016 in Corresponding European Patent Application No. 16171314.4.
(Continued)

*Primary Examiner* — Binh B Tran
*Assistant Examiner* — Michael A Matey
(74) *Attorney, Agent, or Firm* — Kile Park Reed & Houtteman PLLC

(57) ABSTRACT

A cover window of a flexible display device includes a base substrate including an out-folding area, an in-folding area, and peripheral areas disposed on opposing sides of at least one of the out-folding area and the in-folding area, a first hard coating layer at a top surface of the base substrate, the first hard coating layer having a substantially uniform thickness, and a second hard coating layer at a bottom surface of the base substrate opposite to the top surface, the second hard coating layer having a thickness different from the
(Continued)

thickness of the first hard coating layer. A thickness of a first area of the second hard coating layer that overlaps with the out-folding area and the in-folding area of the base substrate is less than a thickness of a second area of the second hard coating layer that overlaps with the peripheral areas of the base substrate.

12 Claims, 20 Drawing Sheets

(51) Int. Cl.
  *H05K 5/03* (2006.01)
  *H05K 1/02* (2006.01)
  *H05K 1/14* (2006.01)
  *G02F 1/1333* (2006.01)

(52) U.S. Cl.
  CPC ............. *H05K 1/147* (2013.01); *H05K 1/181* (2013.01); *H05K 1/189* (2013.01); *H05K 5/03* (2013.01); *G02F 2001/133331* (2013.01); *H05K 2201/055* (2013.01); *H05K 2201/058* (2013.01); *H05K 2201/10128* (2013.01)

(58) Field of Classification Search
  CPC .... H05K 2201/058; H05K 2201/10128; G02F 1/133305; G02F 2001/133331
  See application file for complete search history.

(56) References Cited

U.S. PATENT DOCUMENTS

| | | | |
|---|---|---|---|
| D721,671 S | 1/2015 | Nam et al. | |
| 9,429,999 B2 | 8/2016 | Lee et al. | |
| 9,639,121 B2* | 5/2017 | Min | G06F 1/1652 |
| 2006/0085352 A1 | 4/2006 | Hug | |
| 2006/0098153 A1 | 5/2006 | Slikkerveer et al. | |
| 2009/0021666 A1* | 1/2009 | Chen | G02F 1/133305 |
| | | | 349/58 |
| 2012/0300383 A1* | 11/2012 | Lauder | H01F 7/04 |
| | | | 361/679.26 |
| 2013/0100055 A1 | 4/2013 | Lauder et al. | |
| 2013/0169515 A1 | 7/2013 | Prushinskiy et al. | |
| 2013/0328917 A1 | 12/2013 | Zambetti et al. | |
| 2014/0043741 A1* | 2/2014 | Smith | H05K 5/02 |
| | | | 361/679.3 |
| 2015/0049428 A1* | 2/2015 | Lee | G06F 1/1652 |
| | | | 361/679.27 |
| 2015/0062525 A1* | 3/2015 | Hirakata | G02F 1/133305 |
| | | | 349/158 |
| 2015/0146386 A1* | 5/2015 | Namkung | H01L 51/0097 |
| | | | 361/749 |
| 2015/0146387 A1* | 5/2015 | Lee | G06F 1/1679 |
| | | | 361/749 |
| 2015/0147532 A1 | 5/2015 | Nam et al. | |
| 2015/0351232 A1 | 12/2015 | Cok et al. | |
| 2015/0357395 A1 | 12/2015 | Cheon et al. | |
| 2016/0014881 A1* | 1/2016 | Shin | G06F 1/1616 |
| | | | 361/749 |
| 2016/0014883 A1 | 1/2016 | Cho et al. | |
| 2016/0062516 A1* | 3/2016 | Jeong | G06F 1/1643 |
| | | | 345/174 |
| 2016/0105950 A1 | 4/2016 | Drzaic | |
| 2016/0143162 A1 | 5/2016 | Van Dijk | |
| 2016/0170257 A1 | 6/2016 | Zhang et al. | |
| 2016/0268313 A1 | 9/2016 | Qin et al. | |
| 2016/0327987 A1* | 11/2016 | Huitema | G06F 1/163 |
| 2017/0045914 A1* | 2/2017 | Namkung | G06F 1/1652 |
| 2017/0098794 A1* | 4/2017 | Cho | H01L 51/0097 |
| 2018/0217639 A1* | 8/2018 | Jones | H05K 1/028 |

FOREIGN PATENT DOCUMENTS

| | | |
|---|---|---|
| CN | 204143779 | 2/2015 |
| CN | 104424851 | 3/2015 |
| EP | 2 840 460 A1 | 2/2015 |
| KR | 10-2014-0108971 A | 9/2014 |
| KR | 10-2015-0011103 A | 1/2015 |
| KR | 10-2015-0025415 A | 3/2015 |
| KR | 10-2015-0045972 A | 4/2015 |
| WO | WO 2014/137113 A1 | 9/2014 |

OTHER PUBLICATIONS

The Chinese Office Action dated Aug. 23, 2019 of the corresponding Chinese Patent Application No. 201610561041.7.

* cited by examiner

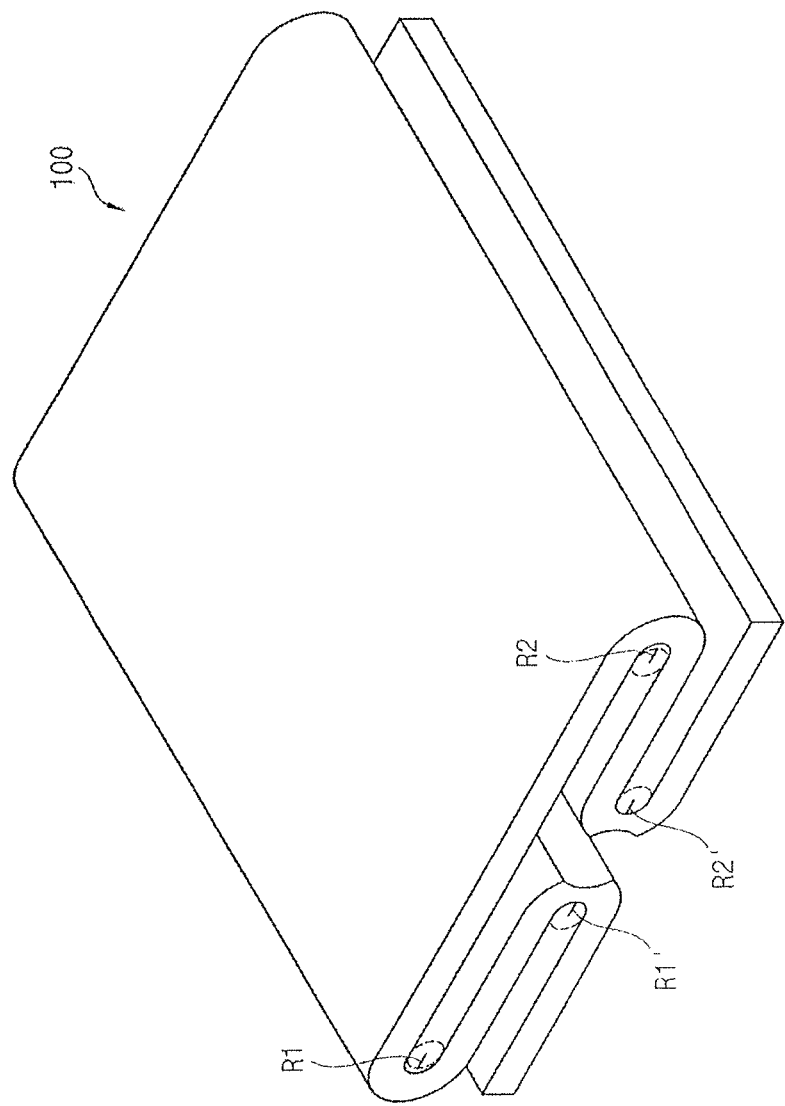

COVER WINDOW OF FLEXIBLE DISPLAY DEVICE AND FLEXIBLE DISPLAY DEVICE HAVING THE SAME

CROSS REFERENCE TO RELATED APPLICATIONS

This is a continuation application based on pending application Ser. No. 15/180,111, filed Jun. 13, 2016, the entire contents of which is hereby incorporated by reference.

Korean Patent Application No. 10-2015-0120916, filed on Aug. 27, 2015, in the Korean Intellectual Property Office, and entitled: "Cover Window of Flexible Display Device and Flexible Display Device Having the Same," is incorporated by reference herein in its entirety.

BACKGROUND

1. Field

Embodiments relate to a flexible display device.

2. Description of the Related Art

A flexible display device has been recently developed that includes a flexible substrate or film made of a bendable material such as a plastic such that the flexible display device may be bent.

SUMMARY

Embodiments are directed to a cover window of a flexible display device including a base substrate that includes an out-folding area, an in-folding area, and a plurality of peripheral areas each disposed on opposing sides of at least one of the out-folding area and the in-folding area, a first hard coating layer at a top surface of the base substrate, the first hard coating layer having a substantially uniform thickness, and a second hard coating layer at a bottom surface of the base substrate opposite to the top surface, the second hard coating layer having a thickness that is different from the thickness of the first hard coating layer. A thickness of a first area of the second hard coating layer that overlaps with the out-folding area and the in-folding area of the base substrate is less than a thickness of a second area of the second hard coating layer that overlaps with the peripheral areas of the base substrate.

The thickness of the second area of the second hard coating layer may be less than the thickness of the first hard coating layer.

A bottom surface of the first area of the second hard coating layer may be in a form of a curved groove.

A bottom surface of the first area of the second hard coating layer may be in a form of a square groove.

The first area of the second hard coating layer may include convex patterns that are periodically arranged along a folding axis that defines the first area.

The first area of the second hard coating layer may include concave patterns that are periodically arranged along a folding axis which defines the first area.

The out-folding area of the base substrate may correspond to a folding area where the second hard coating layer is foldable toward an inner side when the cover window is folded. The in-folding area of the base substrate may correspond to a folding area where the first hard coating layer is foldable toward the inner side when the cover window is folded.

A curvature of the out-folding area may be different from a curvature of the in-folding area when the cover window is fully folded.

A curvature of the out-folding area may be substantially the same as a curvature of the in-folding area when the cover window is fully folded.

The first hard coating layer and the second hard coating layer may include the same material.

The first hard coating layer and the second hard coating layer may include different materials from each other.

The thickness of the second area may be greater than the thickness of the first hard coating layer.

Embodiments are also directed to a flexible display device including a flexible display panel that includes a main display area, the main display area being a flat display area, and further includes an out-folding area, an in-folding area, and a plurality of sub-display areas each located on opposing sides of at least one of the out-folding area and the in-folding area, and a cover window on a light emitting surface of the flexible display panel, the cover window overlapping the main display area, the out-folding area, the in-folding area, and the sub-display areas. The cover window includes a base substrate including a transparent film, a first hard coating layer at a top surface of the base substrate, the first hard coating layer having a substantially uniform thickness, and a second hard coating layer between a bottom surface of the base substrate and the light emitting surface, the second hard coating layer having a thickness that is different from the thickness of the first hard coating layer. A thickness of a first area of the second hard coating layer that overlaps with the out-folding area and the in-folding area is less than a thickness of a second area of the second hard coating layer that overlaps with the main display area and the sub-display areas.

The sub-display area includes a first sub-display area adjacent to a first side of the main display area, wherein a non-light emitting surface of the first sub-display area opposite to the light emitting surface faces a non-light emitting surface of the main display area when the out-folding area is fully folded, a second sub-display area adjacent to the first sub-display area, wherein the light emitting surface of the second sub-display area faces a light emitting surface of the first sub-display area when the in-folding area is fully folded, a third sub-display area adjacent to a second side of the main display area opposite to the first side, wherein a non-light emitting surface of the third sub-display area faces the non-light emitting surface of the main display area when the out-folding area is fully folded, and a fourth sub-display area adjacent to the third sub-display area, wherein a light emitting surface of the fourth sub-display area faces the light emitting surface of the third sub-display area when the in-folding area is fully folded. Widths of the first to fourth sub-display areas in a first direction from the second side to the first side may be less than half a width of the main display area in the first direction.

The out-folding area may include a first out-folding area between the first side of the main display area and the first sub-display area and a second out-folding area between the second side of the main display area and the third sub-display area. The in-folding area may include a first in-folding area between the first sub-display area and the second sub-display area and a second in-folding area between the third sub-display area and the fourth sub-display area.

The second hard coating layer may include convex patterns periodically arranged along a folding axis that defines the first area.

The first area of the second hard coating layer may be concave.

A curvature of the first out-folding area may be different from a curvature of the second out-folding area when the flexible display device is fully folded.

A curvature of the first out-folding area may be substantially the same as a curvature of the second out-folding area when the flexible display device is fully folded.

Curvatures of the first out-folding area, the second out-folding area, the first in-folding area, and the second in-folding area may be substantially the same when the flexible display device is fully folded.

Curvatures of the first out-folding area and the second out-folding area may be different from curvatures of the first in-folding area and the second in-folding area when the flexible display device is fully folded.

The flexible display panel may further include a first flexible printed circuit board (FPCB) connected to a third side of the main display area, a part of a third side of the first out-folding area, and a part of a third side of the second out-folding area, the first FPCB having a bridge form, a second FPCB connected to a fourth side of the first sub-display area opposite to the third side, a fourth side of the second sub-display area, and a part of a fourth side of the first in-folding area, the second FPCB having a bridge form, and a third FPCB connected to a fourth side of the third sub-display area, a fourth side of the fourth sub-display area, and a part of a fourth side of the second in-folding area, the third FPCB having a bridge form.

Each of the first to third FPCBs may include a driving chip mounted as a chip-on-film (COF).

The flexible display device may further include a first guide member at a non-light emitting surface of the second sub-display area of the flexible display panel to guide movements of the first and second sub-display areas and to guide folding and unfolding of the first out-folding area and the first in-folding area, and a second guide member at a non-light emitting surface of the fourth sub-display area of the flexible display panel to guide movements of the third and fourth sub-display areas and to guide the folding and unfolding of the second out-folding area and the second in-folding area.

The first guide member and the second guide member may moveable to incline in a direction away from the light emitting surface to guide unfolding of the second and fourth sub-display areas when the first and second in-folding areas are unfolded.

The first guide member may extends in the first direction when the first out-folding area is unfolded. The second guide member may extend in an opposite direction of the first direction when the second out-folding area is unfolded.

BRIEF DESCRIPTION OF THE DRAWINGS

Features will become apparent to those of skill in the art by describing in detail exemplary embodiments with reference to the attached drawings in which:

FIGS. 2A to 2C illustrate diagrams illustrating examples of the cover window illustrated in FIG. 1 being in a folded state.

DETAILED DESCRIPTION

Figure 1A:
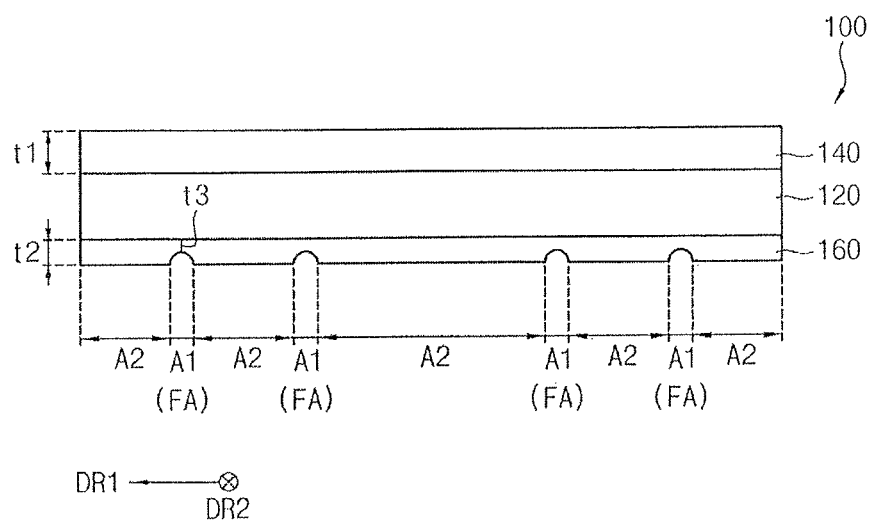
FIG. 1A illustrates a cross-sectional view of a cover window of a flexible display device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Figure 1B:
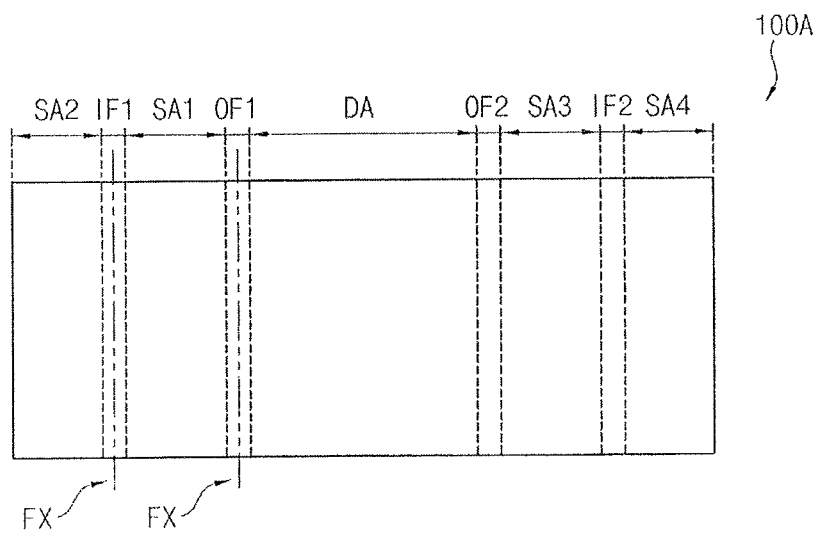
FIG. 1B illustrates a diagram illustrating an example of the cover window illustrated in FIG. 1 placed on a flexible display device.

FIG. 1A illustrates a cross-sectional view of a cover window of a flexible display device according to example embodiments. FIG. 1B illustrates a diagram depicting an example of the cover window illustrated in FIG. 1 placed on a flexible display device.

Referring to FIGS. 1A and 1B, the cover window 100 and 100A included in a flexible display device may include a base substrate 120, a first hard coating layer 140, and a second hard coating layer 160. The cover window 100 and 100A may correspond to the shape of the flexible display device such that at least parts of the cover window 100 and 100A may be bent, rolled, and/or folded.

The cover window 100 and 100A may include out-folding areas OF1 and OF2, in-folding areas IF1 and IF2, and a plurality of peripheral areas DA, SA1, SA2, SA3, and SA4 each disposed on opposing sides of at least one of the out-folding area OF1 and OF2 and the in-folding area IF1 and IF2. The out-folding area OF1 and OF2 and the in-folding area IF1 and IF2 may correspond to areas in which the cover window 100A is folded. The cover window 100 and 100A may be folded along a folding axis FX defined in each of the out-folding area OF1 and OF2 and the in-folding area IF1 and IF2. The folding axis FX may be an imaginary line. The peripheral areas DA, SA1, SA2, SA3, and SA4 may include a main display area DA and sub display areas SA1, SA2, SA3, and SA4. For example, as illustrated in FIGS. 1A and 1B, the cover window 100 and 100A may include two in-folding areas IF1 and IF2, two out-folding areas OF1 and OF2, one main display area DA, and four sub-display areas SA1, SA2, SA3, and SA4. In some embodiments, the out-folding area OF1 and OF2 may correspond to a folding area in which the second hard coating layer 160 is folded toward an inner side when the cover window 100A is folded. The in-folding area IF1 and IF2 may correspond to a folding area in which the first hard coating layer 140 is folded toward ab inner side when the cover window 100A is folded.

In some embodiments, the first to fourth sub-display areas SA1 to SA4 may be folded to overlap the main display area DA when the cover window 100 and 100A is fully folded along the in-folding areas IF1 and IF2 and the out-folding areas OF1 and OF2.

The base substrate 120 may include the out-folding area OF1 and OF2, the in-folding area IF1 and IF2, and the peripheral areas DA, SA1, SA2, SA3, and SA4 each disposed on opposing sides of at least one of the out-folding area OF1 and OF2 and the in-folding area IF1 and IF2. The base substrate 120 may protect a flexible display panel of the flexible display device. The base substrate 120 may include a transparent plastic film or a thin glass film. For example, the base substrate 120 may include polycarbonate (PC), polymethylmethacrylate (PMMA), polyethylene-terephthalate (PET), polyimide (PI), or a combination thereof. The base substrate 120 may be formed of materials having good optical characteristics, suitable hardness, high flexibility, and high elastic recovery.

The first hard coating layer 140 may be disposed on a top surface of the base substrate 120. The first hard coating layer 140 may have a substantially uniform thickness. The first hard coating layer 140 may improve surface hardness and shock resistance of the cover window 100 and the flexible display device. The first hard coating layer 140 may include materials having good optical characteristics, suitable hardness, high flexibility, and high elastic recovery. The first hard coating layer 140 may include an organic compound or an organic/inorganic composite compound. For example, the organic compound may include an acryl-based compound, an epoxy-based compound or a combination thereof, and the organic/inorganic composite compound may include a silicon compound such as polysilsesquioxane.

In some embodiments, the first hard coating layer 140 may be formed at the top surface of the base substrate 120 by a dipping coating, a spin coating, a spray coating, or evaporating. For example, the base substrate 140 may be dipped in a polymer solution including an acrylic resin and an epoxy resin and dried such that the first hard coating layer 140 is formed.

The second hard coating layer 160 may be disposed on a bottom surface of the base substrate 120 opposite to the top surface. The second hard coating layer 160 may improve the surface hardness and the shock resistance of the cover window 100 and the flexible display device having the same. The second hard coating layer 160 may include first areas A1 each overlapping with (or corresponding to) the in-folding area IF1 and IF2 and out-folding areas OF1 and OF2 and second areas A2 each overlapping with (or corresponding to) the peripheral areas DA, SA1, SA2, SA3, and SA4. A thickness t3 of the first area A1 may be less than a thickness t2 of the second area A2. Thus, a total thickness of the cover window 100 corresponding to the in-folding areas IF1 and IF2 and the out-folding areas OF1 and OF2 may be reduced.

In some embodiments, the first area A1 of the second hard coating layer 160 may include convex patterns periodically arranged along the folding axis FX. The convex patterns may protrude from a surface of the first area A1 in an opposite direction of the base substrate 120. The convex patterns may complement for the thinning folding areas FA (i.e., the in-folding area IF1 and IF2 and the out-folding area OF1 and OF2) such that modulus of the cover window 100 may be improved or optimized.

In some embodiments, the first area A1 of the second hard coating layer 160 may include concave patterns periodically arranged along the folding axis FX. The concave patterns may be recessed toward the base substrate 120 such that the folding area FA may be thinner. Thus, flexibility of the folding area FA may be improved.

The thickness of the second hard coating layer t2 may be different from a thickness of the first hard coating layer t1. A sum of the thickness of the first hard coating layer t1 and the thickness t2 of the second area A2 may be greater than a predetermined thickness such that physical hardness of the cover window 100 may be secured. The second hard coating layer 160 may include the organic compound or the organic/inorganic composite compound as described above with respect to the first hard coating layer 140. For example, the organic compound may include an acryl-based compound, an epoxy-based compound or a combination thereof, and the organic/inorganic composite compound may include a silicon compound such as polysilsesquioxane. When the thickness of the first area A1 of the second hard coating layer 160 is decreased, the curvatures of the in-folding area IF1 and IF2 and the out-folding area OF1 and OF2 may decrease when the folding areas FA are fully folded. Thus, it may be easy to implement in-folding and out-folding of the cover window 100. In addition, when the sum of the thickness t1 of the first hard coating layer and the thickness t2 of the second area A2 is optimal, suitable hardness of the cover window 100 may be secured.

In some embodiments, the second hard coating layer 160 may be formed at the top surface of the base substrate 120 by dipping coating, spin coating, spray coating, or evaporating. For example, the base substrate 120 may be dipped in a polymer solution including an acrylic resin and an epoxy resin and dried such that the second hard coating layer 160 is formed. The first area A1 may be concave from the base substrate 120.

In some embodiments, the first hard coating layer 140 and the second hard coating layer 160 may be attached to the based substrate 120 by at least one of an optically clear adhesive (OCA) or a binder.

In some embodiments, as illustrated in FIG. 1A, the thickness t2 of the second hard coating layer (i.e., the second area A2) may be less than the thickness of the first hard coating layer t1. For example, the thickness t1 of the first hard coating layer may be about 35 um, and the thickness t2 of the second area of the second hard coating layer may be about 5 um.

In some embodiments, the first hard coating layer 140 and the second hard coating layer 160 may be made of the same material. For example, the first hard coating layer 140 and the second hard coating layer 160 may include the same organic compound or the same organic/inorganic composite compound. In some embodiments, the first hard coating layer 140 and the second hard coating layer 160 may be made of different materials. For example, the first hard coating layer 140 may be exposed to the outside of the display device. Accordingly, the material included in the first hard coating layer 140 may be selected to have a higher modulus than the second hard coating layer 160. The curvature of the second hard coating layer 160 may be less than the first hard coating layer 140. Accordingly, the material included in the second hard coating layer 160 may have lower bending stiffness than the first hard coating layer 140.

As described above, the cover window 100 and 100A in the flexible display device may have reduced thickness at the in/out-folding areas IF1, IF2, OF1, and OF2 such that the curvatures of the in/out-folding areas IF1, IF2, OF1, and OF2 may be minimized while maintaining sufficient hardness. Thus, the cover window 100 and 100A may be easily folded or bent to the inside and the outside. Accordingly, the flexible display device may be easy to fold and modify, and portability of the flexible display device may be improved. Further, shapes of the in-folding area IF1 and IF2 and the out-folding area OF1 and OF2 may be substantially the same such that manufacturing costs may be reduced.

Figure 2A:
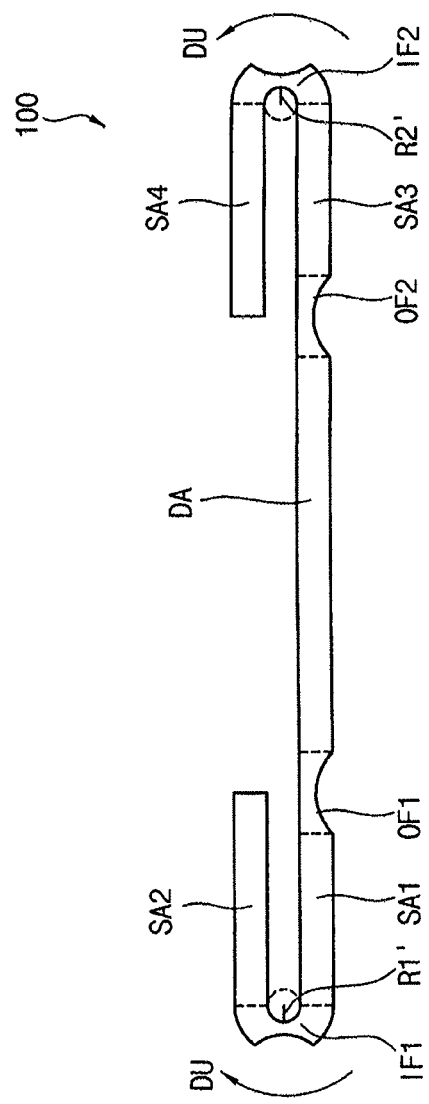
Figure 2B:
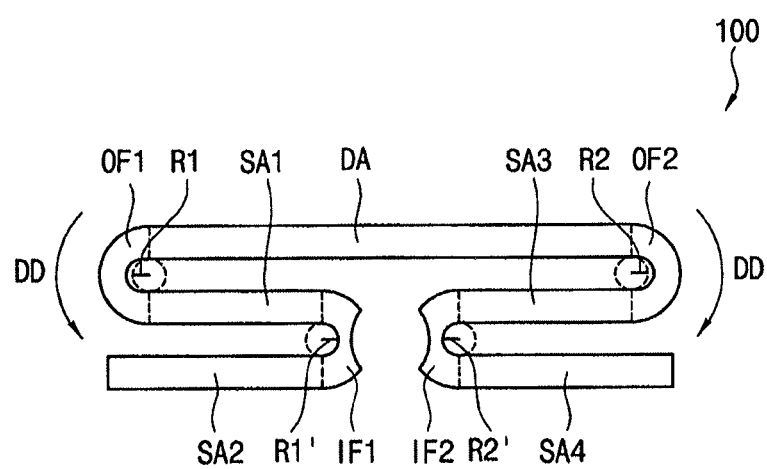

FIGS. 2A to 2C illustrate diagrams depicting examples where the cover window of FIG. 1 is folded.

Referring to FIGS. 2A to 2C, the cover window 100 may include in-folding parts and out-folding parts.

The cover window 100 in FIGS. 2A to 2C may be applied in a flexible display device. Accordingly, the cover window 100 may include a main display area DA, first and second in-folding areas IF1 and IF2, first and second out-folding areas OF1 and OF2, and first to fourth sub-display areas SA1 to SA4.

FIG. 2A shows an example where parts of the cover window 100 are folded. In some embodiments, the first in-folding area IF1 and/or the second in-folding area IF2 may be folded in an upper side direction (direction of arrow DU). Users can see images through the upper side of the cover window 100, which may include the first hard coating layer (see, e.g., FIG. 1A). A lower side opposite to the upper side may be disposed on a flexible display panel. The lower side of the cover window 100 may include the second hard coating layer. As folded, the second sub-display area SA2 may overlap with the first sub-display area SA1. Also, the first hard coating layer may be folded toward the inner side when the first in-folding area IF1 is folded. The upper side of the first sub-display area SA1 may face the upper side of the second sub display area SA2. Similarly, the fourth sub-display area SA4 may overlap with the third sub-display area SA3 such that the upper side of the third sub-display area SA3 faces the upper side of the fourth sub display area SA4.

The first areas A1 of the second hard coating layer corresponding to the first and second in-folding areas IF1 and IF2 may be located at outer sides of the first and second in-folding areas IF1 and IF2. The in-folding areas IF1 and IF2 of the second hard coating layer may be concave such that the first and second in-folding areas IF1 and IF2 are thin compared with other portions. The bending stiffness of the first and second in-folding areas IF1 and IF2 may be less than that of the main display area DA and the first to fourth sub-display areas SA1 to SA4. When the bending stiffness of the in-folding areas IF1 and IF2 are reduced, curvatures of the in-folding areas R1' and R2' may be reduced. A slimmer shape of the flexible display device may be provided due to the reduced curvatures of the in-folding areas R1' and R2'

In some embodiments, the curvature of the first in-folding area R1' may be substantially the same as the curvature of the second in-folding area R2' when the first and second in-folding areas IF1 and IF2 are fully folded. In this case, heights of both ends of the cover window 100 may be the same when the when the first and second in-folding areas IF1 and IF2 are fully folded.

In some embodiments, the curvature of the first in-folding area R1' may be different from the curvature of the second in-folding area R2' when the first and second in-folding areas IF1 and IF2 are fully folded. In this case, the heights of the ends of the cover window 100 may be different from each other when the first and second in-folding areas IF1 and IF2 are fully folded. Thus, it may be easier to grip the device.

As illustrated in FIGS. 2B and 2C, the first and second out-folding areas OF1 and OF2 may be folded in a lower side direction (direction of arrow DD). The first sub-display area SA1 overlap with a part of the main display area DA and the third sub-display area SA3 may overlap with another part of the main display area DA. The second hard coating layer corresponding to the first and third sub-display areas SA1 and SA3 may be folded toward the inner side when the first and second out-folding areas OF1 and OF2 are folded. The lower side of the main display area DA may face the lower side of the first sub-display area SA1 and the lower side of the third sub-display area SA3.

The first areas of the second hard coating layer corresponding to the first and second out-folding areas OF1 and OF2 may be located at inner sides of the first and second out-folding areas OF1 and OF2. The first and second out-folding areas OF1 and OF2 of the second hard coating layer may be concave such that the first and second out-folding areas OF1 and OF2 are thin compared with other portions. Thus, the bending stiffness of the first and second out-folding areas OF1 and OF2 may be less than that of the main display area DA and the first to fourth sub-display areas SA1 to SA4. When the bending stiffness of the out-folding areas OF1 and OF2 are reduced, curvatures of the out-folding areas R1 and R2 may be reduced. A flexible display device having a slimmer shape may be implemented due to the reduced curvatures of the out-folding areas R1 and R2.

In some embodiments, the curvature of the first out-folding area R1 may be substantially the same as the curvature of the second out-folding area R2 when the first and second out-folding areas OF1 and OF2 are fully folded. In this case, heights of both ends of the cover window 100 may be the same when the when the first and second out-folding areas OF1 and OF2 are fully folded.

In some embodiments, the curvature of the first out-folding area R1 may be different from the curvature of the second out-folding area R2 when the first and second out-folding areas OF1 and OF2 are fully folded. In this case, the heights of ends of the cover window 100 may be different from each other when the when the first and second out-folding areas OF1 and OF2 are fully folded. Thus, it may be easier to grip the device.

In some embodiments, at least one of the curvatures of the first and second out-folding areas and the first and second in-folding areas R1, R2, R1', and R2' may be different when all of the folding areas are fully folded.

The first and second out-folding areas OF1 and OF2 and the first and second in-folding areas IF1 and IF2 of the cover window 100 may be thinner than the main display area DA and the sub-display areas SA1 to SA4 of the cover window 100, such that the curvatures of the folding areas R1, R2, R1', and R2' may be minimized (or reduced compared with a general cover window). Thus, it may be possible to manufacture a bidirectional sliding flexible display device.

Figure 3:
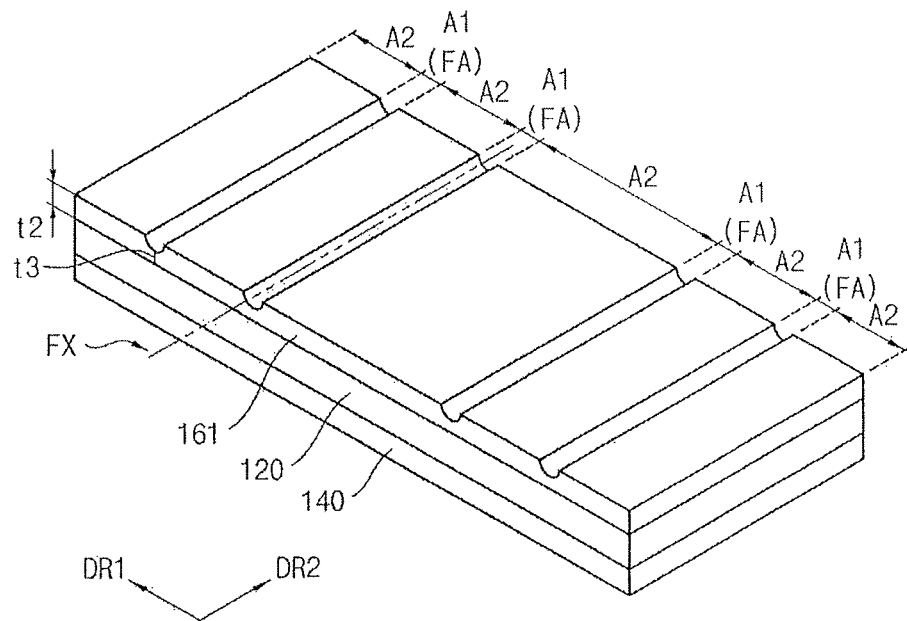
FIG. 3 illustrates a perspective view depicting an example of the cover window of FIG. 1.
Figure 4:
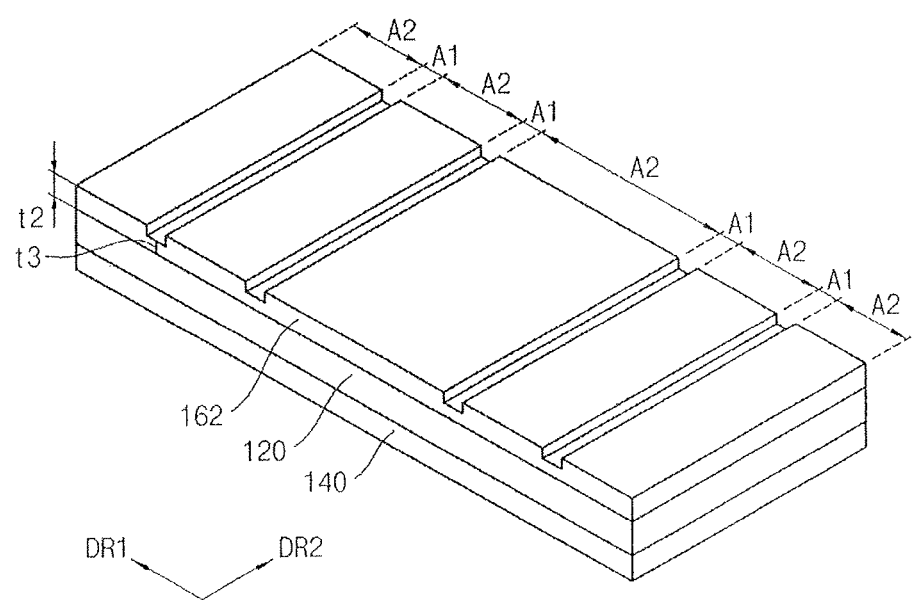
FIG. 4 illustrates a perspective view depicting another example of the cover window of FIG. 1.
Figure 5:
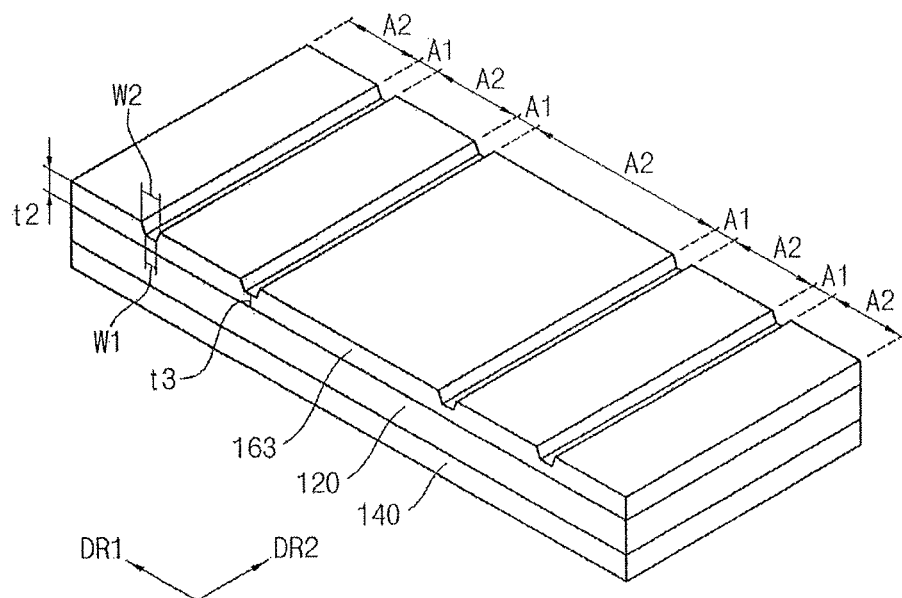
FIG. 5 illustrates a perspective view depicting another example of the cover window of FIG. 1.
Figure 6:
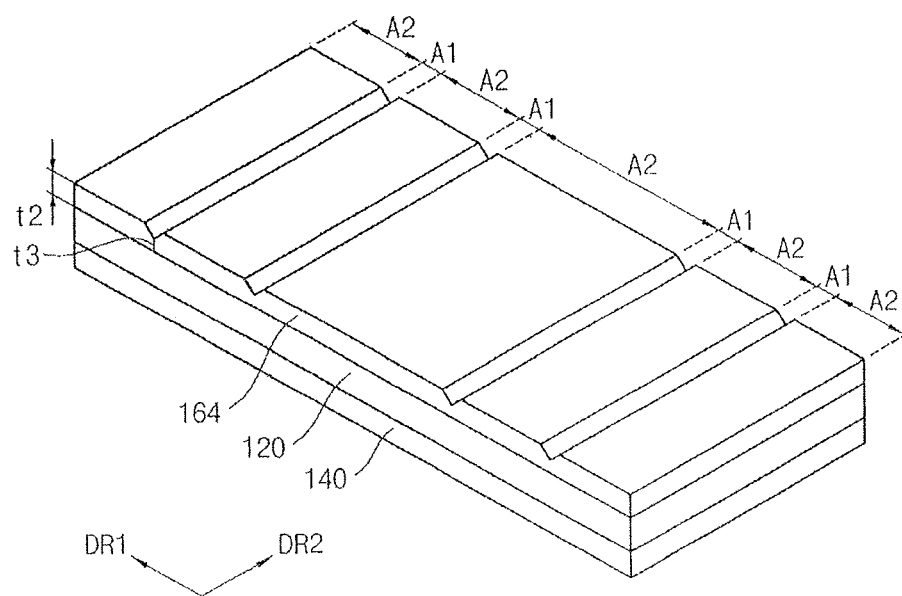
FIG. 6 illustrates a perspective view depicting another example of the cover window of FIG. 1.

FIG. 3 illustrates a perspective view depicting an example of the cover window of FIG. 1. FIG. 4 is a perspective view depicting another example of the cover window of FIG. 1. FIG. 5 is a perspective view depicting another example of the cover window of FIG. 1. FIG. 6 illustrates a perspective view depicting another example of the cover window of FIG. 1.

In FIGS. 3 to 6, like reference numerals are used to designate elements of the cover window the same as those in FIG. 1A, and detailed description of these elements will not be repeated. The cover windows of FIGS. 3 to 6 may be substantially the same as or similar to the cover window of FIG. 1A except for details of the second hard coating layer.

Referring to FIGS. 1A, 1B, and 3 to 6, the cover window may include a base substrate 120, a first hard coating layer 140, and a second hard coating layer 161, 162, 163, and 164.

The second hard coating layer 161 may include first areas A1 overlapping with folding areas FA and second areas A2 overlapping peripheral areas. The first areas A1 and the second areas A2 may be arranged in a first direction (direction of arrow DR1). The first areas A1 of the second hard coating area 161, 162, 163, and 164 may be thinner than the second areas A2. Each of the folding areas FA may be folded along a folding axis FX. The folding axis may be an imaginary line that extends along a second direction (direction of arrow DR2) perpendicular to the first direction DR1.

As illustrated in FIG. 3, a bottom surface of the first area A1 of the second hard coating area 161 may be a curved groove. A thickness t3 of one first area A1 in the first direction DR1 may be not uniform. For example, the thickness of a center portion of the first area A1 may be the less than other portions. The thickness t3 of first area A1 in the second direction DR2 may be substantially uniform. In some embodiments, the thickness of the center portion of the first area A1 may correspond to about 20% to about 80% of the thickness t2 of the second area A2.

The bending stress (or folding stress) may be substantially concentrated in the folding areas FA when the cover window 100 is folded. The thickness t3 of the first area A1 corresponding to the folding area FA may be less than the thickness t2 of the second area A2 such that the folding stress on the folding area FA may be reduced.

As illustrated in FIG. 4, the thickness t3 of the first area A1 of the second hard coating area 162 may be less than the thickness t2 of the second area A2. In this embodiment, the bottom surface of the first area A1 may be a square groove. For example, the thickness t3 of the first area A1 may be substantially uniform. In some embodiments, the thickness t3 of the first area A1 may correspond to about 20% to about 80% of the thickness t2 of the second area A2. The thickness t3 of the first area A1 corresponding to the folding area FA may be less than the thickness t2 of the second area A2 such that the folding stress on the folding area FA may be reduced.

As illustrated in FIG. 5, the thickness t3 of the first area A1 of the second hard coating area 162 may be less than the thickness t2 of the second area A2. In this embodiment, the bottom surface of the first area A1 may be a square groove. A width W1 of a first portion of the first area A1 closer to the base substrate may be less than a width W2 of a second portion of the first area A1. For example, a cross section of the first area A1 may be a trapezoidal shape. The width W1 of the first portion may be uniform in the second direction DR2. In some embodiments, the thickness t3 of the first area A1 may correspond to about 20% to about 80% of the thickness t2 of the second area A2. The thickness t3 of the first area A1 corresponding to the folding area FA may be less than the thickness t2 of the second area A2 such that the folding stress on the folding area FA may be reduced.

As illustrated in FIG. 6, the thickness t3 of the first area A1 of the second hard coating area 162 may be less than the thickness t2 of the second area A2. In the this embodiment, a cross section of the first area A1 may be a triangular shape. The thickness t3 of the first area A1 in the first direction DR1 may be not uniform. For example, the thickness of the center portion of the first area A1 may be the thinnest. The thickness t3 of first area A1 in the second direction DR2 may be substantially uniform. In some embodiments, the thickness of the center portion of the first area A1 may correspond to about 20% to about 80% of the thickness t2 of the second area A2. The thickness t3 of the first area A1 corresponding to the folding area FA may be less than the thickness t2 of the second area A2 such that the folding stress on the folding area FA may be reduced.

Figure 7:
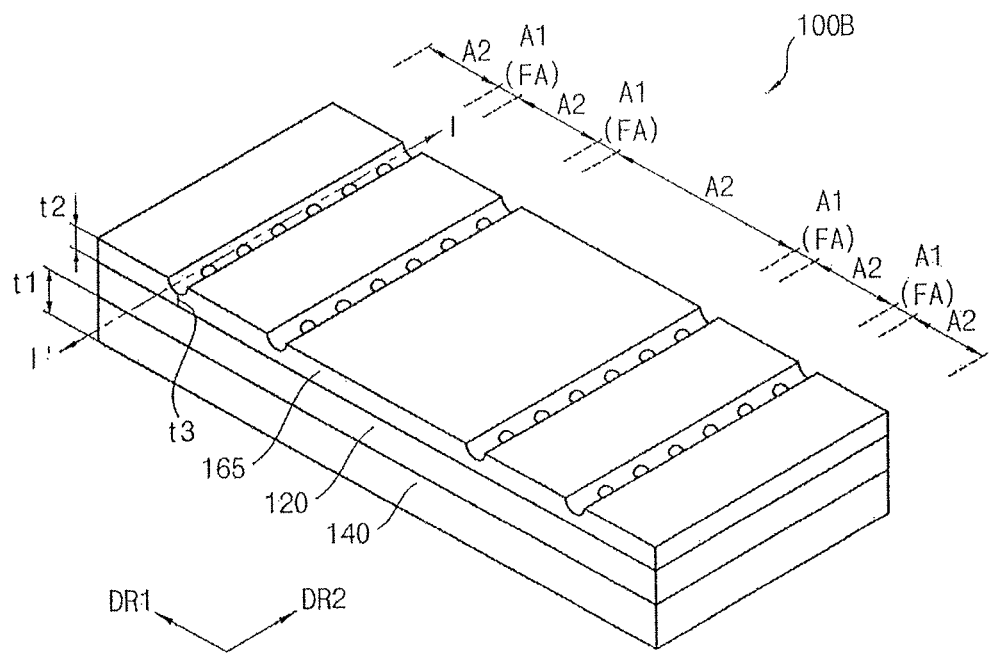
FIG. 7 illustrates a diagram of a cover window of a flexible display device according to example embodiments.

FIG. 7 is a diagram of a cover window of a cover window of a flexible display device according to an example embodiment.

In FIG. 7, like reference numerals are used to designate elements of the cover window the same as those in FIG. 1A, and detailed description of these elements may not be repeated. The cover window of FIG. 7 may be substantially the same as or similar to the cover window of FIG. 1A except for details of the second hard coating layer.

Referring to FIG. 7, the cover window 100B may include a base substrate 120, a first hard coating layer 140, and a second hard coating layer 165.

The second hard coating layer 165 may include first areas A1 overlapping with folding areas FA and second areas A2 overlapping peripheral areas. The first areas A1 and the second areas A2 may be arranged in a first direction (direction of arrow DR1). The first areas A1 of the second hard coating area 161, 162, 163, and 164 may be thinner than the second areas A2. In some embodiments, the first area A1 of the second hard coating layer 165 may include convex patterns periodically arranged along a folding axis that defines the first area A1. The folding axis may be an imaginary line extended along a second direction (direction of arrow DR2) perpendicular to the first direction DR1. The convex patterns may protrude from the base substrate 120 (i.e., a bottom substrate of the second hard coating layer 165). Thus, a thickness of the portions of the first area A1 including the convex patterns may be greater than the thickness of the portions of the first area A1 not including the convex patterns. For example, the thickness of the portions of the first area A1 including the convex patterns may be substantially the same as the thickness of the second area A2.

Deterioration of the modulus due to reduction of the thickness of the folding area FA may be reduced. The modulus and flexibility of the folding area FA may be controlled by adjusting the widths between the convex patterns and heights (or the thickness) of the convex patterns.

In some embodiments, the first area A1 of the second hard coating layer 165 may include concave patterns periodically arranged along the folding axis (i.e., in the second direction DR2). The concave patterns may be recessed toward the base substrate 120.

Figure 8:
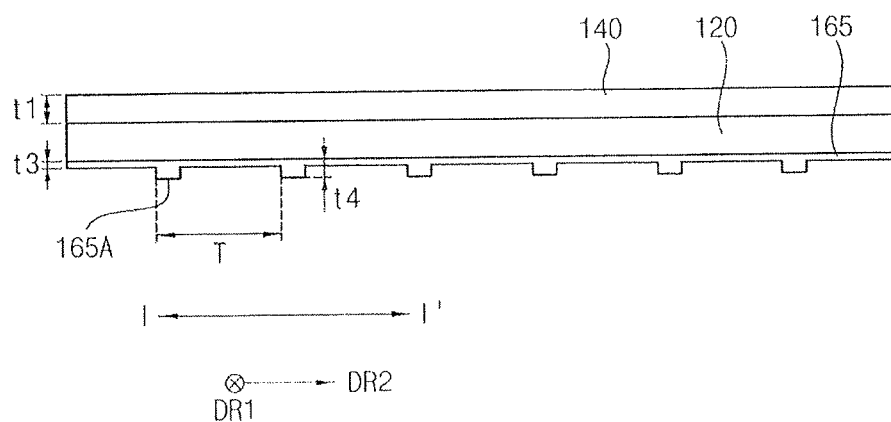
FIG. 8 illustrates a partial cross-sectional view taken along section line I-I' in FIG. 7 according to an example.
Figure 9:
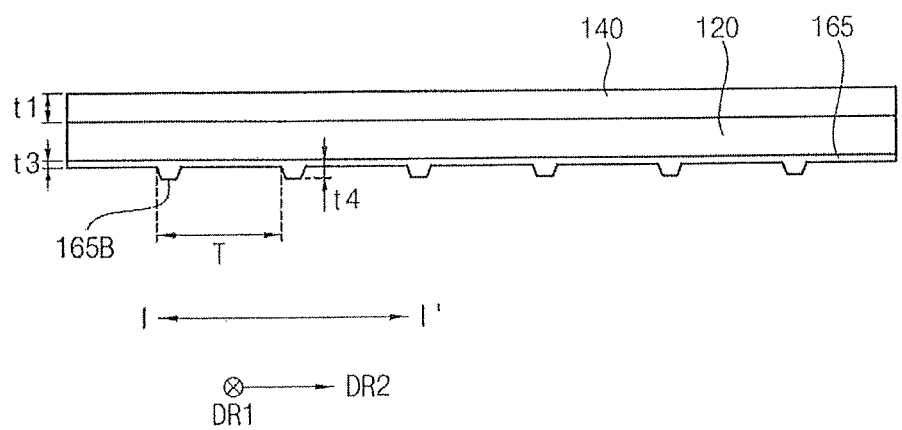
FIG. 9 illustrates a partial cross-sectional view taken along section line I-I' in FIG. 7 according to an example.
Figure 10:
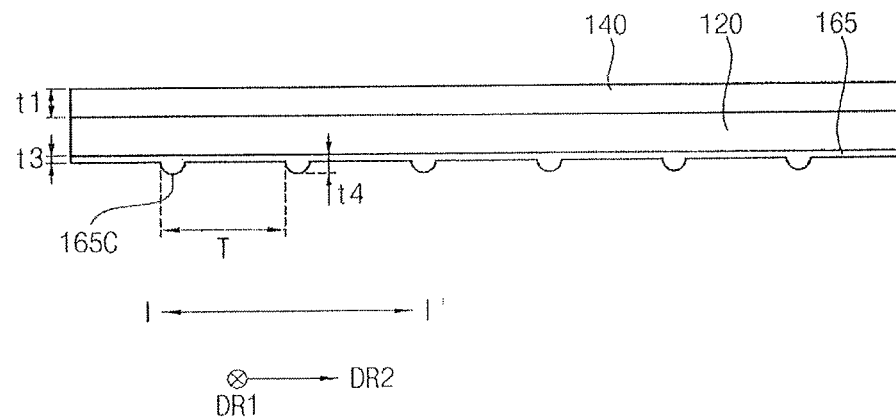
FIG. 10 illustrates a partial cross-sectional view taken along section line I-I' in FIG. 7 according to an example.
Figure 11:
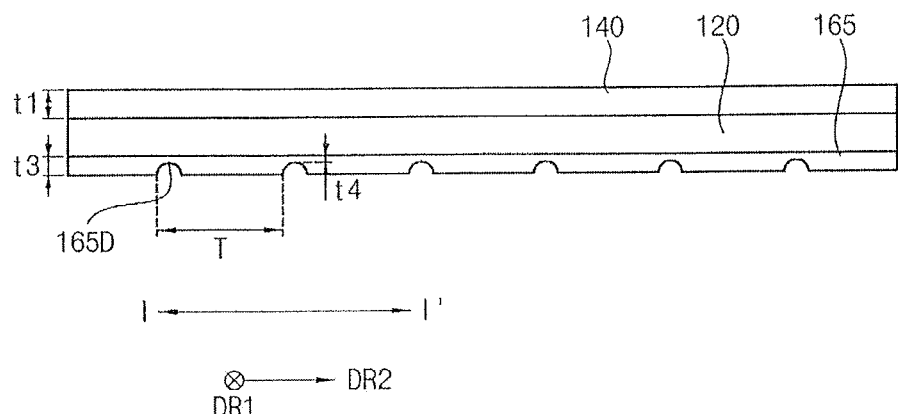
FIG. 11 illustrates a partial cross-sectional view taken along section line I-I' in FIG. 7 according to an example.

FIG. 8 illustrates a partial cross-sectional view taken along section line I-I' in FIG. 7, according to an example. FIG. 9 illustrates a partial cross-sectional view taken along section line I-I' in FIG. 7, according to another example. FIG. 10 illustrates a partial cross-sectional view taken along section line I-I' in FIG. 7, according to another example. FIG. 11 illustrates an example of a partial cross-sectional view taken along section line I-I' in FIG. 7, according to another example.

In FIGS. 8 to 11, like reference numerals are used to designate elements of the cover window the same as those in FIGS. 1A and 7, and detailed description of these elements may not be repeated. The cover windows of FIGS. 8 to 11 may be substantially the same as or similar to the cover window of FIG. 7 except for details of the second hard coating layer.

Referring to FIGS. 7 to 11, the first area A1 of the second hard coating layer 165 in the cover window 100B of FIG. 7 may include convex patterns or concave patterns.

The cross section taken along section line I-I' of the cover window 100B of FIG. 7 may be the first area A1 corresponding to a folding area FA. FIGS. 8 to 11 show parts of the cross section of the first area A1 taken along the second direction DR2.

The cover window 100B may include a base substrate 120, a first hard coating layer 140, and a second hard coating layer 165. The base substrate 120 may be between the first hard coating layer 140 and the second hard coating layer 165. A thickness of the second hard coating layer, e.g., t3+t4, may be less than a thickness of the first hard coating layer t1.

As illustrated in FIG. 8, a first area A1 of the second hard coating layer 165 may include convex patterns 165A arranged along a folding axis that defines the first area A1. The folding axis may be an imaginary line extended along a second direction (direction of arrow DR2) perpendicular to the first direction DR1. In some embodiments, the width of the convex patterns 165A may be substantially uniform. A planar section of the convex patterns 165A may have a circular shape or a square shape. As an example, the convex patterns 165A may be periodically arranged in the second direction DR2 with a predetermined period T. As another example, the convex patterns 165A may be aperiodically arranged in the second direction DR2.

In some embodiments, a thickness t4 of the convex pattern may be substantially the same as the thickness t2 of the second area A2 of the second hard coating layer 165. In some embodiments, the thickness t4 of the convex pattern may be less than the thickness t2 of the second area A2. Accordingly, the thickness t4 of the convex pattern may be controlled such that the tensile modulus of the folding area FA relatively thinner than peripheral area may be improved or optimized.

As illustrated in FIG. 9, the first area A1 of the second hard coating layer 165 may include convex patterns 165B arranged in the second direction DR2. In some embodiments, each convex pattern 165B may have a taper. For example, a cross section of the convex pattern 165B may be a trapezoidal shape. The convex patterns 165B may be periodically arranged in the second direction DR2 to have a predetermined period T. In other implementations, the convex patterns 165B may be aperiodically arranged in the second direction DR2. In some embodiments, the thickness of the convex patterns t4 may be substantially the same as the thickness t2 of the second area A2 of the second hard coating layer 165. In other implementations, the thickness t4 of the convex pattern may be less than the thickness t2 of the second area A2.

As illustrated in FIG. 10, the first area A1 of the second hard coating layer 165 may include convex patterns 165C arranged in the second direction DR2. In the this embodiment, the each convex pattern 165C may have a taper. For example, the convex pattern 165C may have a hemispherical shape. The convex patterns 165C may be periodically arranged in the second direction DR2 to have a predetermined period T. In other implementations, the convex patterns 165C may be aperiodically arranged in the second direction DR2. In some embodiments, the thickness of the convex patterns t4 may be substantially the same as the thickness t2 of the second area A2 of the second hard coating layer 165. In other implementations, the thickness t4 of the convex pattern may be less than the thickness t2 of the second area A2.

As illustrated in FIG. 11, the first area A1 of the second hard coating layer 165 may include concave patterns 165D arranged in the second direction DR2. The concave patterns 165D maybe recessed toward the base substrate 120. The convex patterns 165C may be periodically arranged in the second direction DR2 to have a predetermined period T. In other implementations, the convex patterns 165C may be aperiodically arranged in the second direction DR2. A thickness t4 of the first area A1 including the concave patterns may be less than the thickness t3 of the first area A1 not including the concave patterns. In other implementations, the thickness t3 of the first area A1 may be less than the thickness t2 of the second area A2. Accordingly, the thickness t4 of the concave pattern may be controlled such that tensile modulus and flexibility of the folding area FA may be improved or optimized.

As described above, the folding area FA of the second hard coating layer 165, which is relatively thinner than peripheral area, may include the convex patterns or the concave patterns such that the tensile modulus and flexibility of the folding area FA of the cover window may be improved.

Figure 12:
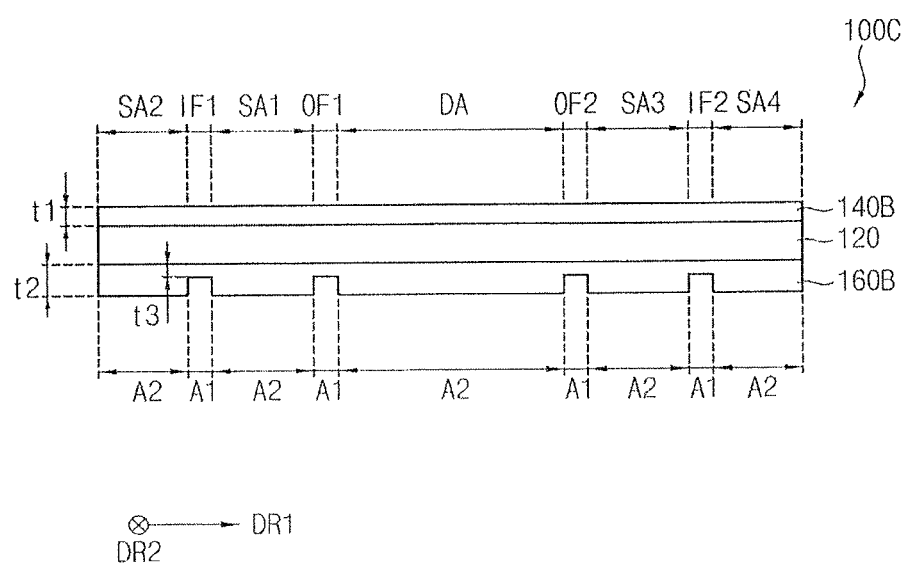
FIG. 12 illustrates a diagram of a cover window of a flexible display device according to example embodiments.

FIG. 12 illustrates a diagram of a cover window of a flexible display device according to example embodiments.

In FIG. 12, like reference numerals are used to designate elements of the cover window that are the same as those in FIGS. 1A and 1B, and detailed description of these elements may not be repeated. The cover window illustrated in FIG. 12 may be substantially the same as or similar to the cover window of FIG. 1A except for details of the second hard coating layer.

Referring to FIG. 12, the cover window 100C may include a base substrate 120, a first hard coating layer 140B, and a second hard coating layer 160B.

The cover window 100C may include an out-folding area OF1 and OF2, an in-folding area IF1 and IF2, and a plurality of peripheral areas DA, SA1, SA2, SA3, and SA4 each disposed on opposing sides of at least one of the out-folding area OF1 and OF2 and the in-folding area IF1 and IF2. The peripheral areas DA, SA1, SA2, SA3, and SA4 may include a main display area DA and sub display areas SA1, SA2, SA3, and SA4.

The base substrate 120 may include a transparent plastic film or a thin glass film. The base substrate 120 may be formed by materials having good optical characteristics, suitable hardness, high flexibility, and high elastic recovery.

The first hard coating layer 140B may be disposed at a top surface of the base substrate 120. The first hard coating layer 140 may have a substantially uniform thickness. The second hard coating layer 160 may be disposed at a bottom surface of the base substrate 120 opposite to the top surface. The second hard coating layer 160 may include first areas A1 overlapping with (or corresponding to) the in-folding areas IF1 and IF2 and out-folding areas OF1 and OF2 and second areas A2 overlapping with (or corresponding to) the peripheral areas DA, SA1, SA2, SA3, and SA4. In the present embodiment, a thickness t2 of the second area of the second hard coating layer may be greater than a thickness t1 of the first hard coating layer. A thickness t3 of the first area A1 may be less than the thickness t2 of the second area A2. Thus, a total thickness of the cover window 100 corresponding to the in-folding areas IF1 and IF2 and the out-folding areas OF1 and OF2 may be reduced.

In some embodiments, the first area A1 of the second hard coating layer 160B may include convex patterns periodically arranged in the second direction DR2. The convex patterns may protrude from a surface of the first area A1 in an opposite direction of the base substrate 120. Thus, the convex patterns may complement for the thinning folding areas (i.e., the in-folding area IF1 and IF2 and the out-folding area OF1 and OF2) such that modulus of the cover window 100C may be improved or optimized.

As described above, the cover window 100C in the flexible display device may have reduced thickness at the in/out-folding areas IF1, IF2, OF1, and OF2 such that the curvatures of the in/out-folding areas IF1, IF2, OF1, and OF2 may be minimized while maintaining the high hardness.

Figure 13A:
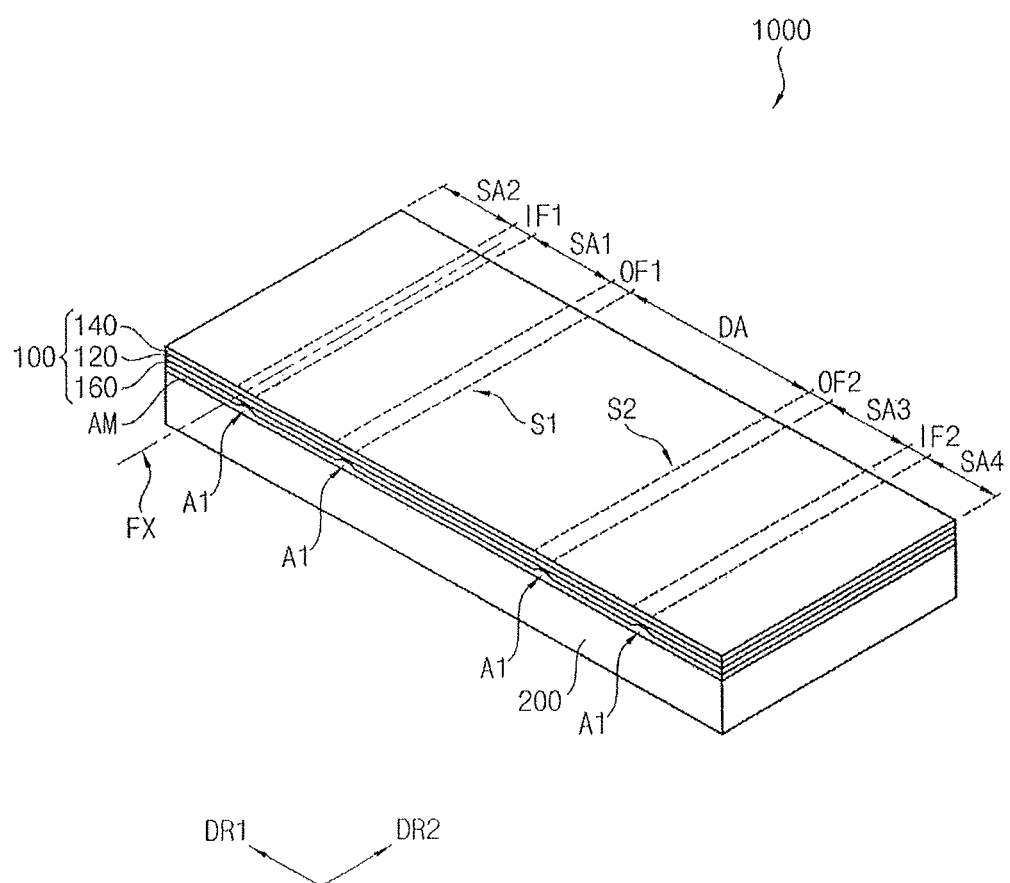
FIG. 13A illustrates a diagram of a flexible display device according to example embodiments.
Figure 13B:
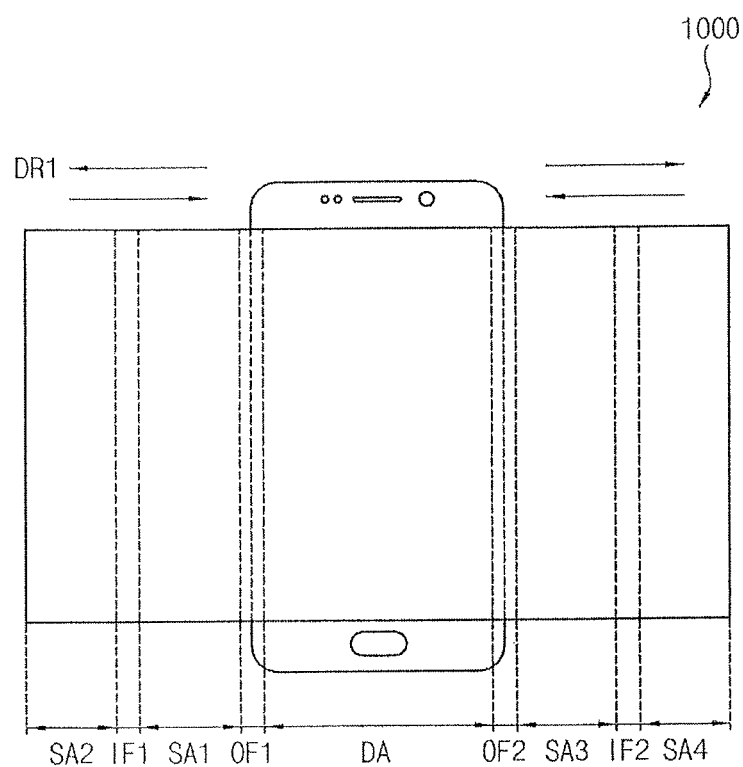
FIG. 13B illustrates a diagram depicting the flexible display device illustrated in FIG. 13A according to an example.

FIG. 13A illustrates a diagram of a flexible display device according to example embodiments. FIG. 13B illustrates a diagram illustrating an example of the flexible display device of FIG. 13A superposed on a general display device for comparison.

Referring to FIGS. 13A and 13B, the flexible display device 1000 may include a flexible display panel 200 and a cover window 100. The cover window 100 may correspond to one of the cover windows described referring to FIGS. 1A to 12.

The flexible display device 1000 may include at least parts that may be bent, rolled, and/or folded. For example, the flexible display device 1000 may be a sliding flexible display device such that that first to fourth sub-display areas SA1 to SA4 of the cover window 100 may selectively overlap a lower side (or non-light emitting surface) of a main display area DA by folding in or out the folding areas IF1, IF2, OF1, and OF2.

The flexible display device 1000 (i.e., the flexible display panel 200) may include the in-folding area IF1 and IF2, the out-folding area OF1 and OF2, and a plurality of peripheral areas each disposed on opposing sides of at least one of the out-folding area and the in-folding area OF1, OF2, IF1, and IF2. The peripheral areas may include the main display area DA and the sub-display areas SA1 to SA4. The main display area 1000 may display a main image when the flexible display device 1000 is fully folded. The out-folding areas OF1 and OF2 may be folding areas between the main display area DA and the first sub-display area SA1 and between the main display area DA and the third display area SA3. In some embodiments, the out-folding areas OF1 and OF2 may be fully folded such that non-light emitting surfaces of the display area and the sub-display areas SA1 and SA3 face each other. The in-folding area IF1 and IF2 may be folding areas between the first sub-display area SA1 and the second sub-display area SA2 and between the third sub-display area SA3 and the fourth sub-display area SA4. In some embodiments, the in-folding areas IF1 and IF2 may be fully folded such that light emitting surfaces of the first sub-display area SA1 and the second sub-display area SA2 face each other and light-emitting surfaces of third sub-display area SA3 and the fourth sub-display area SA4 face each other.

The flexible display device 1000 may include the first to fourth sub-display areas SA1 to SA4. The first sub-display area SA1 may be disposed adjacent to a first side S1 of the main display area DA1. The first out-folding area OF1 may be between the main display area DA and the first sub-display area SA1. The non-light emitting surface of the first sub-display area SA1 opposite to the light emitting surface may face the non-light emitting surface of the main display area DA when the first out-folding area OF1 is fully folded. The second sub-display area SA2 may be disposed adjacent to the first sub-display area SA1. The first in-folding area IF1 may be between the first sub-display area SA1 and the second sub-display area SA2. The light emitting surface of the second sub-display area SA2 may face the light emitting surface of the first sub-display area SA1 when the first in-folding area IF1 is fully folded. The third sub-display area SA3 may be disposed adjacent to a second side S2 of the main display area DA opposite to the first side S1. The second out-folding area OF2 may be between the main display area DA and the third sub-display area SA3. The non-light emitting surface of the third sub-display area SA3 may face the non-light emitting surface of the main display area DA when the second out-folding area OF2 is fully folded. The fourth sub-display area SA4 may be disposed adjacent to the third sub-display area SA3. The second in-folding area IF2 may be between the third sub-display area SA3 and the fourth sub-display area SA4. The light emitting surface of the fourth sub-display area SA4 may face the light emitting surface of the third sub-display area SA3 when the second in-folding area is fully folded In some embodiments, widths of the first to and second sub-display areas SA1 to SA2 in a first direction DR1 from the first side S1 to the second side S2 may be less than half a width of the main display area DA1 in the first direction DR1. Widths of the third and fourth sub-display areas SA3 to SA4 in the first direction DR1 from the second side S2 to the first side S1 may be less than half a width of the main display area DA1 in the first direction DR1. Thus, when the flexible display device 1000 is fully folded, the first to fourth sub-display areas SA1 to SA4 may be covered by the main display area DA.

The out-folding area OF1 and OF2 may include the first out-folding area OF1 between the first side S1 of the main display area DA and the first sub-display area SA1 and the second out-folding area OF2 between the second side S2 of the main display area DA and the third sub-display area SA3.

The in-folding area IF1 and IF2 may include the first in-folding area IF1 between the first sub-display area SA1 and the second sub-display area SA2 and the second infolding area IF2 between the third sub-display area SA3 and the fourth sub-display area SA4.

The flexible display device 1000 may include the flexible display panel 200 and the cover window 100. The flexible display device 1000 may further include an adhesive member AM to attach the flexible display panel 200 to the cover window 100. In some embodiments, the flexible display device 1000 may further include functional members between the flexible display panel 200 and the cover window 100. The flexible display device 1000 may further include a guide member at a lower side of the second and fourth sub-display areas SA2 and SA4 of the flexible display panel 200 to guide folding and unfolding of the flexible display device 1000.

The flexible display panel 200 may include a flexible substrate, a plurality of signal lines on the flexible substrate, and a plurality of pixels electrically connected to the signal lines. The pixels may generate an image based on signals receiving from the signal lines. The flexible display panel 200 may display image through the light emitting surface. The flexible display panel 200 may be an organic light emitting display panel, an electrophoretic display panel, etc. The main display area DA, the sub-display areas SA1 to SA4, the in-folding areas IF1 and IF2, and the out-folding areas OF1 and OF2 of the flexible display panel 200 may display the image.

In some implementations, the cover window 100 may be disposed on the light emitting surface of the flexible display panel 200. The cover window 100 may overlap the main display area DA, the sub-display areas SA1 to SA4, the in-folding areas IF1 and IF2, and the out-folding areas OF1 and OF2.

The cover window 100 may include a base substrate 120 having a transparent film, a first hard coating layer 140 on the base substrate 120, and a second hard coating layer 160 between the base substrate 120 and the flexible display panel 200.

The base substrate 120 may include a transparent plastic film or a thin glass film. The base substrate 120 may be formed by materials having good optical characteristics, suitable hardness, high flexibility, and high elastic recovery.

The first hard coating layer 140 may be disposed at a top surface of the base substrate 120. The first hard coating layer 140 may have a substantially uniform thickness. The first hard coating layer 140 may improve surface hardness and shock resistance of the cover window 100 and the flexible display device 1000 having the same.

The second hard coating layer 160 may be disposed at a bottom surface of the base substrate 120 opposite to the top surface. The second hard coating layer 160 may improve the surface hardness and the shock resistance of the cover window 100 and the flexible display device 1000 having the same. The second hard coating layer 160 may be divided by first areas A1 each overlapping with (or corresponding to) the in-folding area IF1 and IF2 and out-folding areas OF1 and OF2 and second areas A2 each overlapping with (or corresponding to) the peripheral areas DA, SA1, SA2, SA3, and SA4. A thickness of the first area A1 may be less than a thickness of the second area A2. Thus, a total thickness of the cover window 100 corresponding to the in-folding areas IF1 and IF2 and the out-folding areas OF1 and OF2 may be reduced and curvatures of the in/out-folding areas IF1. IF2, OF1, and OF2 may be minimized. For example, the curvatures of the in-folding areas IF1 and IF2 and the out-folding areas OF1 and OF2 may be about from 0.1 mm to about 10 mm In some embodiments, the first area A1 of the second hard coating layer 160 may include convex patterns periodically or aperiodically arranged along a folding axis FX which defines the first area A1. The convex patterns may protrude from the base substrate 120. The convex patterns may complement for the thinning folding areas (i.e., the in-folding area IF1 and IF2 and the out-folding area OF1 and OF2) such that modulus of the cover window 100C may be improved or optimized.

The cover window 100 and the second hard coating layer 160 are described above referred to FIGS. 1A to 12. Accordingly duplicate descriptions will not be repeated.

As illustrated in FIG. 13B, the first and second sub-display areas SA1 and SA2 may be unfolded in the first direction DR1 and folded in an opposite direction of the first direction DR1. When the first in-folding area IF1 and the first out-folding area OF1 is fully folded, the first and second sub-display areas SA1 and SA2 may be covered or overlapped by the main display area DA1. Similarly, the third and fourth sub-display areas SA3 and SA4 may be unfolded in the opposite direction of the first direction DR1 and folded in the first direction DR1. When the second in-folding area IF2 and the second out-folding area OF2 is fully folded, the third and fourth sub-display areas SA3 and SA4 may be covered or overlapped by the main display area DA1.

When the flexible display device 1000 is fully unfolded, an area of the whole display area may be about three times the main display area DA. As shown in FIG. 13B, the display area may be about three times the display area of a general, non-flixible display device as shown in FIG. 13B. The main display area DA, the sub-display areas SA1 to SA4, the in-folding areas IF1 and IF2, and the out-folding areas OF1 and OF2 may display an image. Thus, the flexible display device 1000 may have various sizes of image display and have a bidirectional sliding display. Portability of the flexible display device may be improved.

As described above, the flexible display device 1000 may include the cover window with an improved tensile modulus such that the curvatures of the in/out-folding areas IF1, IF2, OF1, and OF2 may be minimized while maintaining the high hardness. Accordingly, the flexible display device may be easy to fold and modify, and the portability of the flexible display device may be improved. Especially, a sliding flexible display device 1000 capable of in/out-folding may be implemented.

Figure 14:
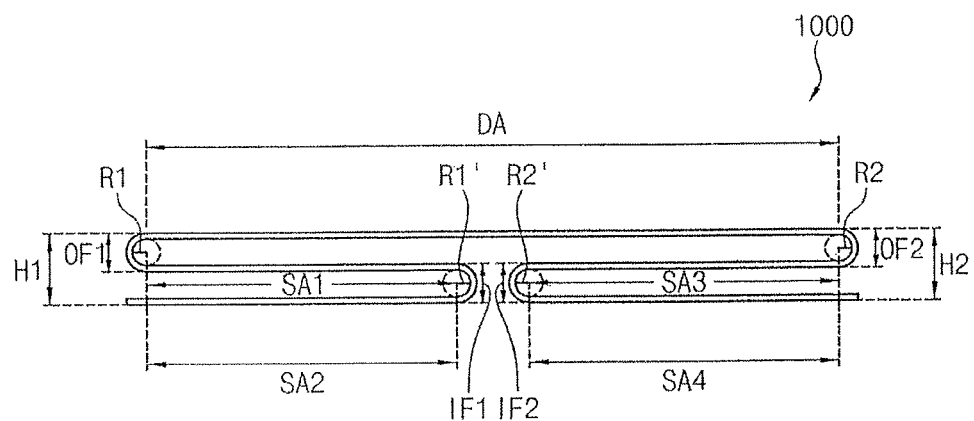
FIG. 14 illustrates a diagram depicting the flexible display device illustrated in FIG. 13A in a fully folded state according to an example.
Figure 15:
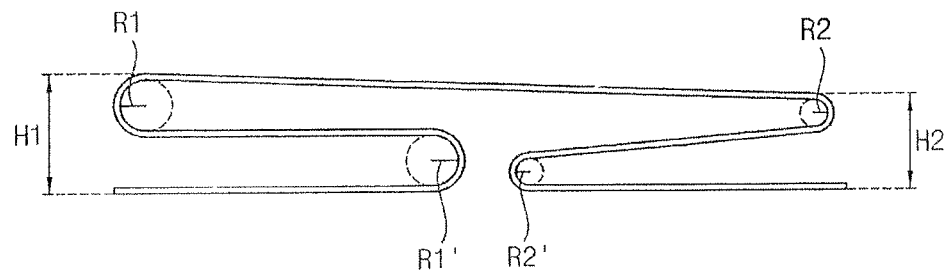
FIG. 15 illustrates a diagram depicting the flexible display device illustrated in FIG. 13A in a fully folded state according to an example.

FIG. 14 illustrates a diagram depicting the flexible display device of FIG. 13A fully folded, according to an example. FIG. 15 illustrates a diagram depicting the flexible display device of FIG. 13A fully folded, according to another example.

Referring to FIGS. 14 and 15, the flexible display device 1000 may include first and second in-folding areas IF1 and IF2 and first and second out-folding areas OF1 and OF2.

The sub-display areas SA1 to SA4 may slide due to an arrangement of the in-folding areas IF1 and IF2 and first and second out-folding areas OF1 and OF2.

In some embodiments, as illustrated in FIG. 14, a curvature R1 of the first out-folding area OF1 may be substantially the same as a curvature R2 of the second out-folding area OF2 when the first and second out-folding areas OF1 and OF2 are fully folded. Similarly, a curvature R1' of the first in-folding area IF1 may be substantially the same as a curvature R2' of the second in-folding area IF2 when the first and second in-folding areas IF1 and IF2 are fully folded. In this, the curvature R1' of the first in-folding area IF1 may be the same as or different from the curvature R1 of the first out-folding area OF1. Thus, when the first and second out-folding areas OF1 and OF2 and the first and second in-folding areas IF1 and IF2 are fully folded, a height of left side H1 of the flexible display device 1000 may be substantially the same as a height of right side H2 of the flexible display device 1000.

In some embodiments, as illustrated in FIG. 15, the curvature R1 of the first out-folding area OF1 may be different form the curvature R2 of the second out-folding area OF2 when the first and second out-folding areas OF1 and OF2 are fully folded. The curvature R1' of the first in-folding area IF1 may be different from the curvature R2' of the second in-folding area IF2 when the first and second in-folding areas IF1 and IF2 are fully folded. In some embodiments, at least one of the curvatures R1, R2, R1', and R2' of the first and second out-folding areas and the first and second in-folding areas OF1, OF2, IF1, and IF2 may be different when all of the folding areas are fully folded. Thus, when the first and second out-folding areas OF1 and OF2 and the first and second in-folding areas IF1 and IF2 are fully folded, the height of one side H1 (for example, the left side) of the flexible display device 1000 may be different from a height of other side H2 (for example, the right side) of the flexible display device 1000. Thus, it may be easier to grip the flexible display device 1000.

Figure 16:
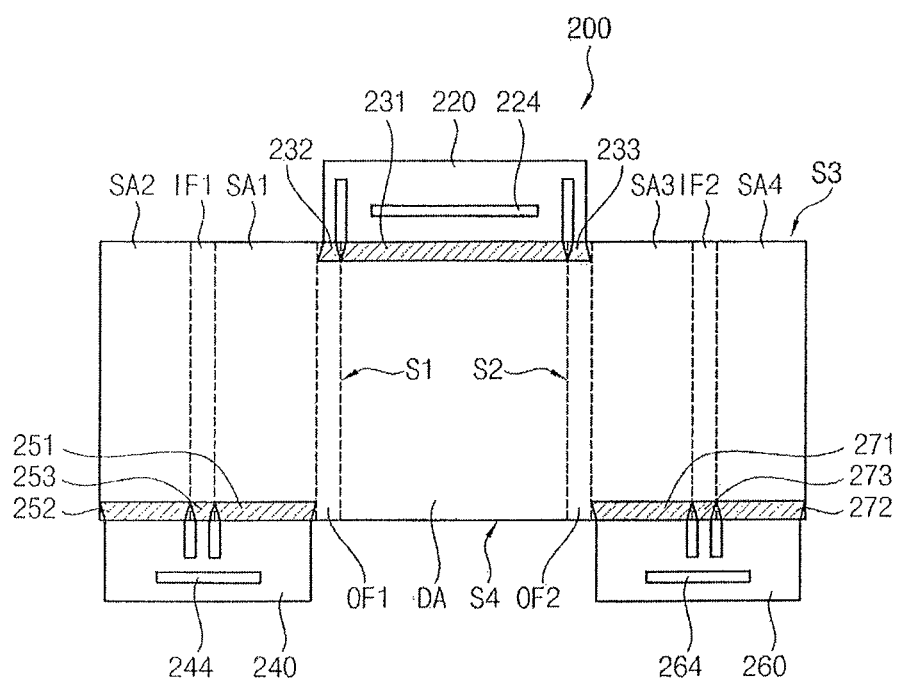
FIG. 16 illustrates a diagram depicting an example of a display panel in the flexible display device of FIG. 13A.

FIG. 16 illustrates a diagram depicting an example of a display panel in the flexible display device of FIG. 13A.

Referring to FIG. 16, the flexible display panel 200 may include first to third flexible printed circuit boards (FPCBs).

The flexible display panel 200 may include a main display area DA, in-folding areas IF1 and IF2, out-folding areas OF1 and OF2, and sub-display areas SA1 to SA4. The display areas and the folding areas of the flexible display panel 200 may include a plurality of pixels electrically connected to signal lines.

The first FPCB 220 may be connected to a third side S3 of the main display area DA, a part of the third side S3 of the first out-folding area OF1, and a part of the third side S3 of the second out-folding area OF2, having a bridge form. As illustrated in FIG. 16, a side of the first FPCB 220 may be not connected to all of the third side S3 of the first and second out-folding areas OF1 and OF2. When the first and second out-folding areas OF1 and OF2 are folded, portions of the first FPCB 220 that overlap with the first and second out-folding areas OF1 and OF2 may be minimized, such that folding stress to the first FPCB 220 may be reduced. Fan-out units 231, 232, and 233 that electrically connect the first FPCB 220 to the display areas DA, OF1, and OF2 as illustrated in FIG. 16 may have a uniform resistance.

The first FPCB 220 may include a driving chip 224 (or a drive integrated circuit) to control images displayed in the out-folding areas OF1 and OF2 and the main display area DA. In some embodiments, the driving chip 224 may include a scan driver, a data driver, and a timing controller.

The second FPCB 240 may be connected to a fourth side S4 of the first sub-display area SA1 opposite to the third side S3, the fourth side S4 of the second sub-display area SA2, and a part of the fourth side S4 of the first in-folding area IF1, having the bridge form. For example, the second FPCB 240 may be connected a part of the first in-folding area IF1. When the first in-folding area IF1 is folded, a portion of the second FPCB 240 that overlaps with the first in-folding area IF1 may be minimized, such that folding stress to the second FPCB 240 may be reduced. In this case, Fan-out units 251, 252, and 253 that electrically connect the second FPCB 240 to the display areas SA1, SA2, and IF1 as illustrated in FIG. 16 may have a uniform resistance.

The second FPCB 240 may include a driving chip 244 (or a drive integrated circuit) to control images displayed in the first in-folding area IF1 and the first and second sub-display areas SA1 and SA2. In some embodiments, the driving chip 244 may include a scan driver, a data driver, and a timing controller.

The third FPCB 260 may be connected to the fourth side S4 of the third sub-display area SA3, the fourth side S4 of the fourth sub-display area SA4, and a part of the fourth side S4 of the second in-folding area IF2, having the bridge form. For example, the third FPCB 260 may be connected a part of the second in-folding area IF2. When the second in-folding area IF2 is folded, a portion of the third FPCB 260 that overlaps with the second in-folding area IF2 may be minimized, such that folding stress to the third FPCB 260 may be reduced. Fan-out units 271, 272, and 273 that electrically connect the third FPCB 260 to the display areas SA3, SA4, and IF2 as illustrated in FIG. 16 may have a uniform resistance.

The third FPCB 260 may include a driving chip 264 (or a drive integrated circuit) to control images displayed in the second in-folding area IF1 and the third and fourth sub-display areas SA3 and SA4. In some embodiments, the driving chip 264 may include a scan driver, a data driver, and a timing controller.

In some embodiments, the driving chips 224, 244, and 264 may be mounted on the first to third FPCBs 220, 240, and 260 as a Chip-On-Film (COF), respectively.

Accordingly, the bridge form FPCBs 220, 240, and 260 may be included in the flexible display panel 200 such that curvatures of the in-folding areas IF1 and IF2 and the out-folding areas OF1 and OF2 may be reduced.

Figure 17:
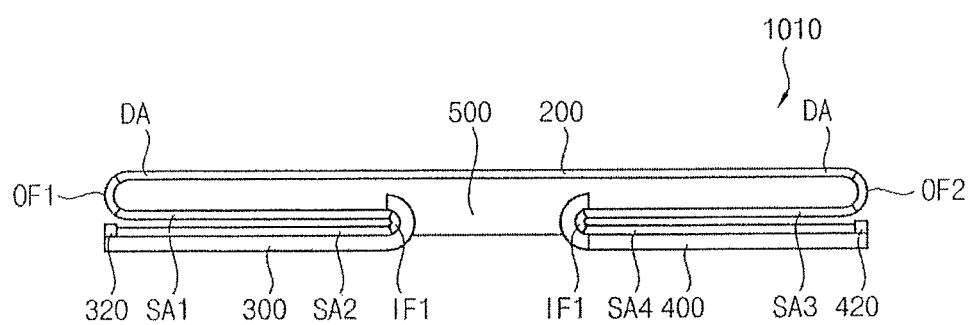
FIG. 17 illustrates a diagram depicting an example of the flexible display device of FIG. 13A including a guide member.
Figure 18A:
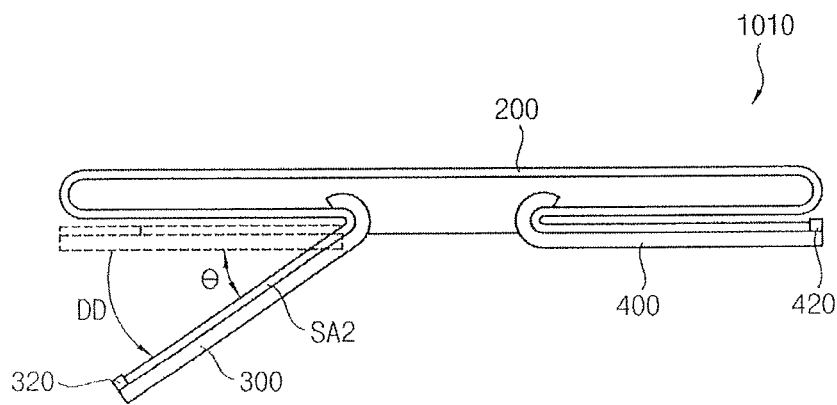
FIGS. 18A to 18C illustrate diagrams depicting unfolding of the flexible display device illustrated in FIG. 17 according to examples.
Figure 18B:
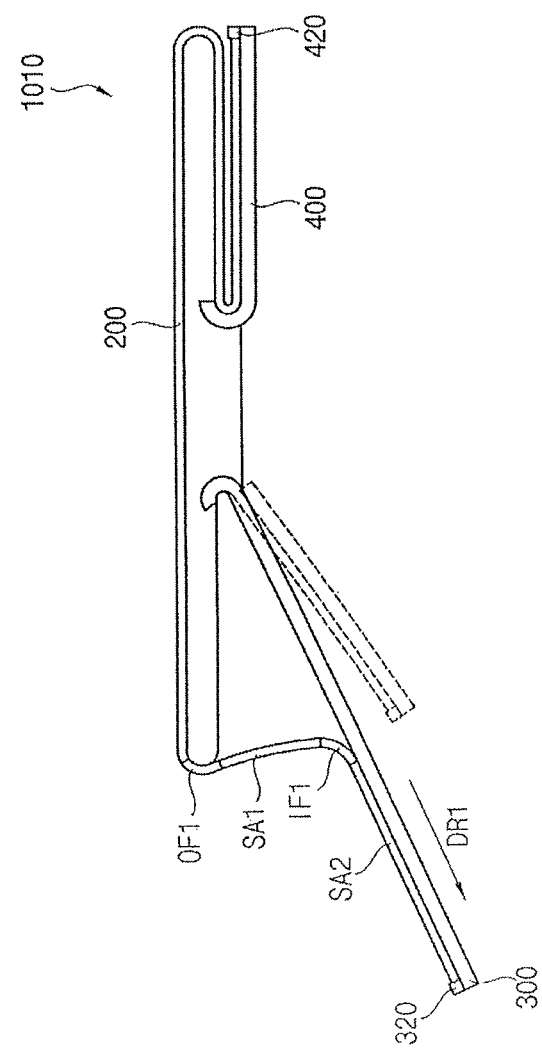
Figure 18C:
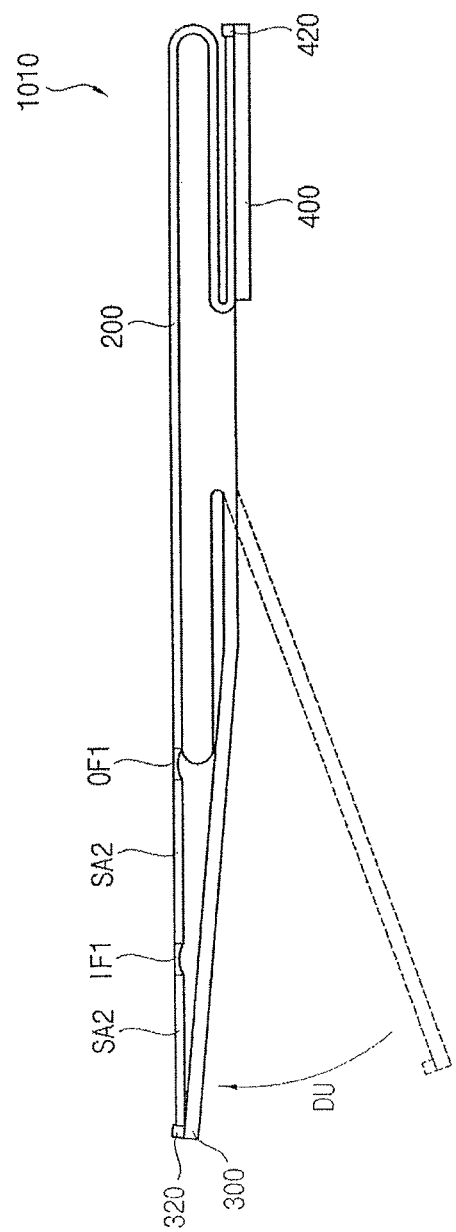

FIG. 17 illustrates a diagram depicting an example of the flexible display device of FIG. 13A including a guide member. FIGS. 18A to 18C illustrate diagrams depicting examples where the flexible display device of FIG. 17 is unfolded.

Referring to FIGS. 13A and 17 to 18C, the flexible display device 1010 may further include a first guide member 300 and a second guide member 400. The flexible display device 1010 may further include a buffer member 500.

The first guide member 300 may be disposed at a non-emitting surface (or a lower surface) of the second sub-display area SA2. For example, the first guide member 300 may cover the non-emitting surface and sides of the second sub-display area SA2. The first guide member 300 may further cover at least a portion of the first in-folding area IF1. The first guide member 300 may guide movements of the first and second sub-display areas SA1 and SA2 and guide folding and unfolding of the first out-folding area OF1 and the first in-folding area IF1. The first guide member 300 may include a first fixing element 320 to maintain the appearance of the flexible display panel 200. The first fixing element 320 may be fixed to an end of the second sub-display area SA2. The first fixing element 320 may prevent from unfolding/sliding of the second sub-display area SA2 when the flexible display panel 200 is fully folded.

In some embodiments, the first guide member 300 and the first fixing element 320 may include a reinforced plastic or a metal.

The second guide member 400 may be disposed at the non-emitting surface (or the lower surface) of the fourth sub-display area SA4. For example, the second guide member 400 may cover the non-emitting surface and sides of the fourth sub-display area SA4. The second guide member 400 may further cover at least a portion of the second in-folding area IF2. The second guide member 400 may guide movements of the third and fourth sub-display areas SA3 and SA4 and may guide the folding and unfolding of the second out-folding area OF2 and the second in-folding area IF2. The second guide member 400 may include a second fixing element 420 to maintain the appearance of the flexible display panel 200. The second fixing element 420 may be fixed to an end of the fourth sub-display area SA4. The second fixing element 420 may prevent from unfolding/sliding the fourth sub-display area SA4 when the flexible display panel 200 is fully folded.

The buffer member 500 may be disposed at the non-light emitting surface of the main display area to maintain/support the appearance of the flexible display device 1010 and to protect the flexible display device 1010 from external shock and pollutants. In some embodiments, the buffer member 500 may include a reinforced plastic or metal.

As illustrated in FIG. 18A, the first guide member 300 may be pivoted to incline in a direction (direction of arrow DD) away from the light emitting surface of the main display area to guide unfolding of the second sub-display area SA2 when the first in-folding area IF1 is unfolded. For example, the first guide member may be rotated to an oblique or perpendicular angle with respect light emitting surface. The first guide member 300 may be rotated in an opposite direction of the direction DD to guide folding of the second sub-display area SA2 when the first in-folding area IF1 is folded. In some embodiments, an inclined angle (or rotated angle) θ may be an acute angle. The guide member 300 may include a bearing or a hinge covering the first in-folding area IF1. The first guide member 300 may be rotated or inclined by a rotation of the bearing or the hinge. Similarly, the second guide member 400 may be pivoted to incline in a direction away from the light emitting surface to guide unfolding of the fourth sub-display area SA4 when the second in-folding area IF2 is unfolded.

As illustrated in FIG. 18B, the first guide member 300 may be extendable in the first direction (direction of arrow DR1) when the first out-folding area OF1 is unfolded. The first guide member 300 may be extended in the first direction DR1 such that the first out-folding area OF1 and the first sub-display area SA1 may be unfolded in the first direction DR1. A length of the first guide member 300 may be decreased in an direction opposite to the first direction DR1 when the first out-folding area OF1 is folded. Similarly, the second guide member 400 may be extended in the opposite direction of the first direction DR1 when the second out-folding area OF2 is unfolded.

As illustrated in FIG. 18C, the first guide member 300 may rotate in the opposite direction DU of the direction DD to lift up the first and second sub-display areas SA1 and SA2 when the first in-folding area IF1, the first out-folding area OF1, the first sub-display area SA1, and the second sub-display area SA2 are fully unfolded. The first and second sub-display areas SA1 and SA2 may be in a substantially straight line with the main display area DA. The first fixing element 320 may hold the flexible display panel 200 to keep the display panel from folding.

The second guide member 400 may be substantially the same as or similar to the first guide member 300. Accordingly, a duplicate descriptions will not be repeated.

Figure 19:
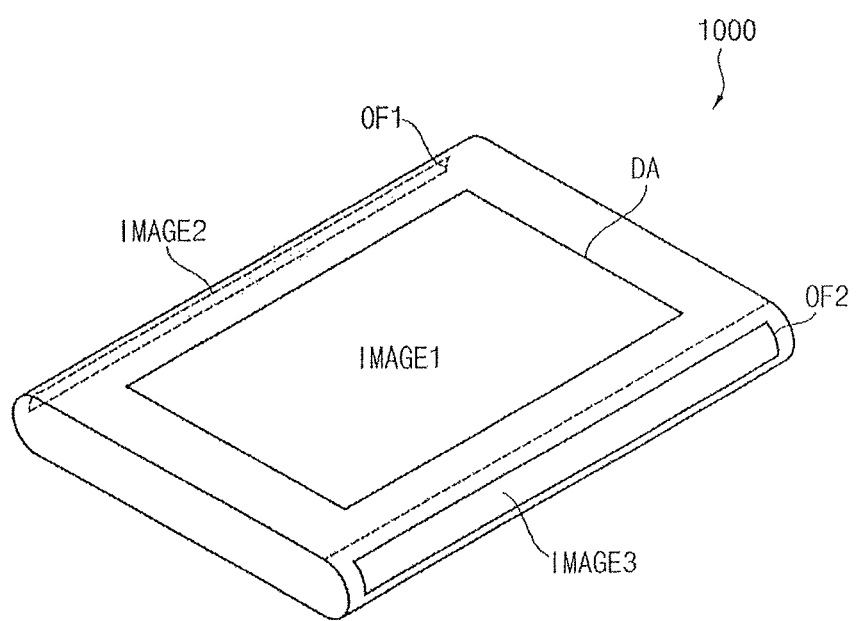
FIG. 19 illustrates a diagram depicting an operation of the flexible display device of FIG. 13 according to an example.

FIG. 19 illustrates a diagram depicting an example of an operation of the flexible display device of FIG. 13.

Referring to FIGS. 13 and 19, the flexible display device 1000 may display images.

As illustrated in FIG. 19, when the flexible display device 1000 is fully folded (in a normal mode) the main display area DA, the first out-folding area OF1, and the second out-folding area OF2 may display a first image IMAGE1, a second image IMAGE2, and a third image IMAGE3, respectively. The first out-folding area OF1 and the second out-folding area OF2 may correspond to curved display areas.

FIGS. 20A to 20D illustrate diagrams depicting examples of operations of the flexible display device of FIG. 13.

Figure 20A:
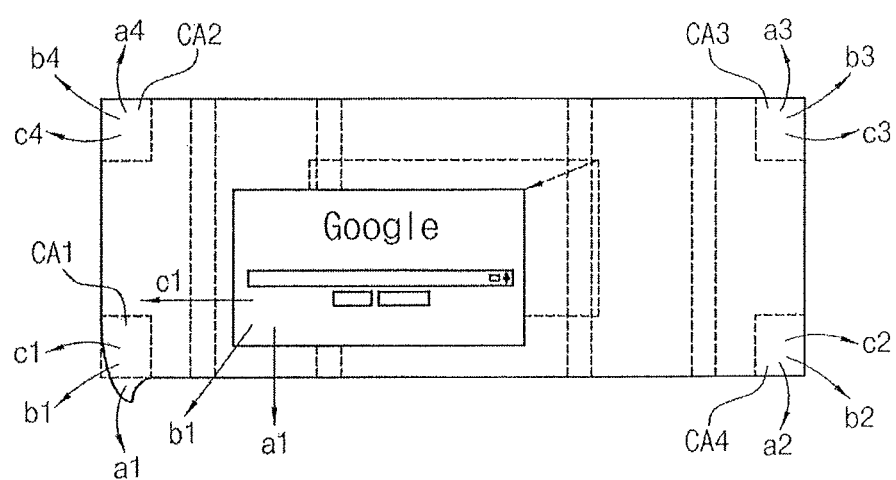
FIGS. 20A to 20D illustrate diagrams illustrating operations of the flexible display device of FIG. 13 according to examples.
Figure 20B:
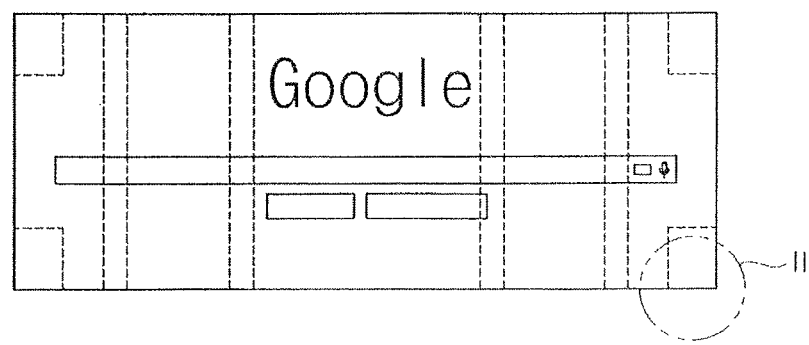
Figure 20C:
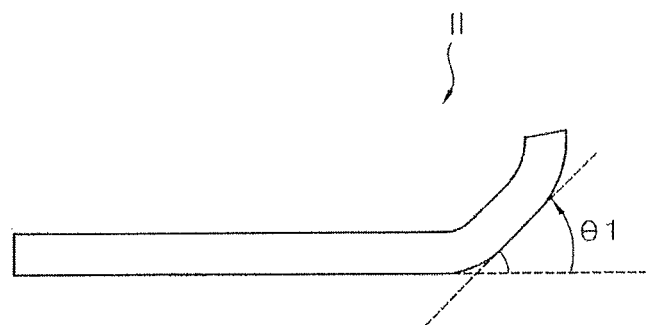

Referring to FIGS. 20A to 20D, a display image may be controlled by touching or bending corners CA1 to CA4 of the flexible display device 1000. FIGS. 20B and 20C roughly shows a cross section of a portion of II of the flexible display device of FIG. 20A.

A state that the flexible display device 1000 is fully unfolded (or extended) may be defined as a wide mode and a state that the flexible display device 1000 is fully folded (illustrated in FIG. 19) may be defined as a normal mode.

In some embodiments, the displayed image may be controlled depending on bending angles of the corners CA1 to CA4. For example, the displayed image may be moved, expanded or reduced based on the bending angles of the corners CA1 to CA4 or touching directions at the corners CA1 to CA4.

In some embodiments, as illustrated in FIG. 20A, when a first corner CA1 is bent in a direction a1, the displayed image may move in the direction a1. When a user drags the first corner CA1 in the direction a1, the displayed image may move in the direction a1. Similarly, when a second corner CA2 or a third corner CA3 is bent in a direction b1 or c1, the displayed image may move in the direction b1 or c1.

As illustrated in FIG. 20B, in the wide mode, the displayed image may be expanded to a maximum size. In some embodiments, the displayed image may be maximized when one of the corners CA1 to CA4 is bent within a predetermined angle range. For example, as illustrated in FIG. 20C, when the one of the corners CA1 to CA4 is bent over a first reference angle θ1 in an upper direction of the flexible display device 1000, the displayed image may be expanded. As another example, when one of the corners CA1 to CA4 is bent below the first reference angle θ1 in the upper direction of the flexible display device 1000, the displayed image may be moved in a direction correspond to a bent direction. As additional examples, other actions for controlling displayed image may be implemented.

Figure 20D:
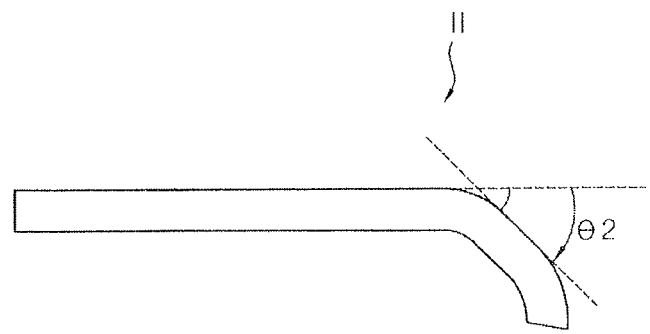

In some embodiments, as illustrated in FIG. 20D, when the one of the corners CA1 to CA4 is bent at an angle greater than a second reference angle θ2 in an lower direction of the flexible display device 1000, the displayed image may be reduced. Other actions for controlling the displayed image may be implemented.

Figure 21:
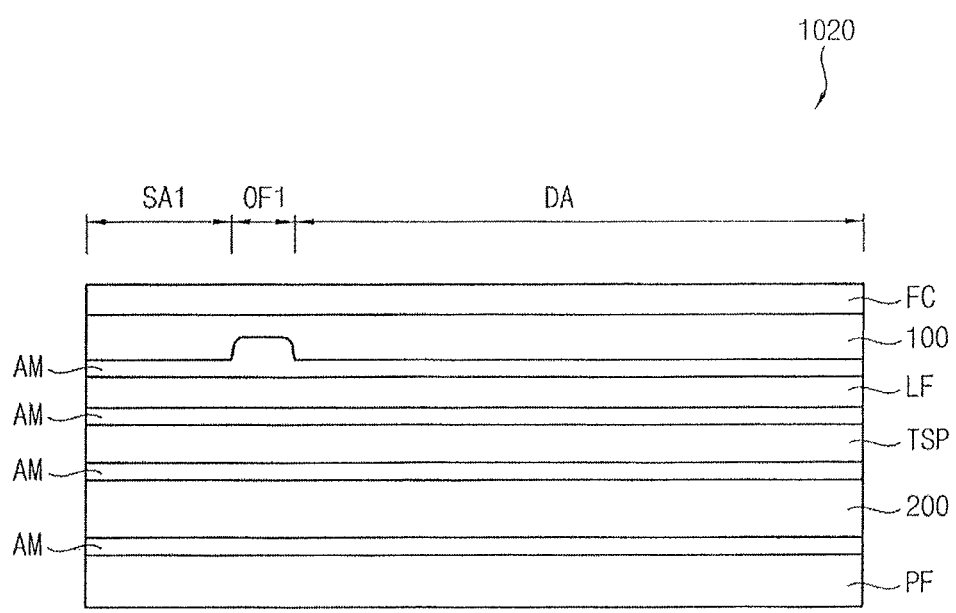
FIG. 21 illustrates a cross-sectional view depicting a portion of the flexible display device of FIG. 13 according to an example.

FIG. 21 illustrates a cross-sectional view depicting an example of a portion of the flexible display device of FIG. 13.

Referring to FIG. 21, the flexible display device 1020 may include a flexible display panel 200, a cover window on a light emitting surface of the flexible display panel 200, and a functional member.

The functional member may include a touch screen TSP and an optical member LF, which are disposed between the flexible display panel 200 and the cover window 100. The touch screen TSP may sense an external input and is attached to the flexible display panel 200 by an adhesive member AM.

The optical member LF may be attached to the touch screen TSP by an adhesive member AM. The optical member LF may include at least a polarizing plate. In addition, the optical member LF may further include a retardation plate. The optical member LF may prevent external light from being reflected. The optical member LF may be omitted or may be included in the touch screen TSP.

The cover window 100 may include a base substrate, a first hard coating layer, and a second hard coating layer. A thickness of a folding area OF1 of the cover window 100 may be less than a thickness of the main display area DA and a sub-display area SA1 of the cover window 100.

A functional coating layer FC may be disposed on the outer surface of the cover window 100. The functional coating layer FC may include at least one of an anti-fingerprint coating layer, an anti-reflection coating layer, and an anti-glare coating layer.

The present embodiments may be applied to a flexible display device and a system including a flexible display device. For example, the present embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

By way of summation and review, a flexible display device may have a flexible display panel and a cover window. The cover window may have a higher bending stiffness than the flexible display panel and a lower flexibility than the flexible display panel. Thus, the flexible display panel may be folded relatively easily, but it may be harder to bend or fold the cover window. For example, the flexible display device may be foldable in one direction (e.g., an in-folding direction) but it may be hard to bend or fold the cover window in an opposite direction. Thus, there may be difficulties in manufacturing various shapes or forms of the flexible display device.

The bending stiffness of the cover window may be decreased when the cover window has a thinner thickness. However, a tensile modulus and hardness may be decreased when the cover window has a thin thickness.

Embodiments provide a cover window of a flexible display device having a second hard coating that has an uneven thickness to facilitate in-folding and out-folding of the flexible display device. Embodiments also provide a flexible display device having the cover window.

The cover window according to example embodiments may have a reduced thickness at the in/out-folding areas such that the curvatures of the in/out-folding areas may be minimized (or reduced) while maintaining a high hardness. Thus, the cover window may be easily folded or bent to the inside or to the outside. Accordingly, the flexible display device may be easy to fold and modify, and portability of the flexible display device may be improved. Further, shapes of the in-folding and the out-folding areas may be substantially the same such that manufacturing costs may be reduced.

In addition, the flexible display device may include the cover window having improved flexibility such that the curvatures of the in/out-folding areas may be minimized (or reduced). Accordingly, the flexible display device may be easy to fold and modify, and portability of the flexible display device may be improved. A sliding flexible display device capable of in/out-folding may be implemented Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus, comprising:
   a cover window on a flexible display device and including:
   a base substrate that includes an out-folding area, an in-folding area, and a plurality of peripheral areas each disposed on opposing sides of at least one of the out-folding area and the in-folding area;
   a first hard coating layer at a top surface of the base substrate, the first hard coating layer having a substantially uniform thickness; and
   a second hard coating layer at a bottom surface of the base substrate opposite to the top surface, wherein
   a thickness of a first area of the second hard coating layer that overlaps with the out-folding area and the in-folding area of the base substrate is less than a thickness of a second area of the second hard coating layer that overlaps with the peripheral areas of the base substrate, an entirety of the thickness of the second area of the second hard coating layer including a same material composition throughout.

2. The apparatus as claimed in claim 1, wherein the thickness of the second area of the second hard coating layer is less than the thickness of the first hard coating layer.

3. The apparatus as claimed in claim 2, wherein a bottom surface of the first area of the second hard coating layer is in a form of a curved groove.

4. The apparatus as claimed in claim 2, wherein a bottom surface of the first area of the second hard coating layer is in a form of a square groove.

5. The apparatus as claimed in claim 2, wherein the first area of the second hard coating layer includes convex patterns that are periodically arranged along a folding axis that defines the first area.

6. The apparatus as claimed in claim 2, wherein the first area of the second hard coating layer includes concave patterns that are periodically arranged along a folding axis that defines the first area.

7. The apparatus as claimed in claim 1, wherein:
   the outfolding area of the base substrate corresponds to a folding area where the second hard coating layer is foldable toward an inner side when the cover window is folded, and
   the infolding area of the base substrate corresponds to a folding area where the first hard coating layer is foldable toward the inner side when the cover window is folded.

8. The apparatus as claimed in claim 7, wherein a curvature of the out-folding area is different from a curvature of the in-folding area when the cover window is fully folded.

9. The apparatus as claimed in claim 7, wherein a curvature of the out-folding area is substantially the same as a curvature of the in-folding area when the cover window is fully folded.

10. The apparatus as claimed in claim 1, wherein the first hard coating layer and the second hard coating layer include the same material.

11. The apparatus as claimed in claim 1, wherein the first hard coating layer and the second hard coating layer include different materials from each other.

12. The apparatus as claimed in claim 1, wherein:
   the first second hard coating layer is a single layer, and the first and second areas of the second hard coating layer are integral with each other to define a single and seamless structure.

\* \* \* \* \*